US008796047B2

(12) United States Patent
Bose et al.

(10) Patent No.: US 8,796,047 B2
(45) Date of Patent: Aug. 5, 2014

(54) SEMICONDUCTOR CHIP REPAIR BY STACKING OF A BASE SEMICONDUCTOR CHIP AND A REPAIR SEMICONDUCTOR CHIP

(71) Applicant: International Business Machines Corporation, Armonk, NY (US)

(72) Inventors: Pradip Bose, Yorktown Heights, NY (US); Eren Kursun, Ossining, NY (US); Jude A. Rivers, Cortlandt Manor, NY (US); Victor Zyuban, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/161,896

(22) Filed: Jan. 23, 2014

(65) Prior Publication Data
US 2014/0159803 A1 Jun. 12, 2014

Related U.S. Application Data

(60) Division of application No. 12/174,198, filed on Jul. 16, 2008, now Pat. No. 8,679,861, which is a continuation-in-part of application No. 11/947,207, filed on Nov. 29, 2007, now abandoned, and a continuation-in-part of application No. 11/948,376, filed on Nov. 30, 2007, now abandoned.

(51) Int. Cl.
| | | |
|---|---|---|
| H01L 25/00 | (2006.01) | |
| H01L 21/66 | (2006.01) | |
| H01L 21/48 | (2006.01) | |
| H01L 21/768 | (2006.01) | |
| G01R 31/317 | (2006.01) | |

(52) U.S. Cl.
CPC .............. *H01L 22/20* (2013.01); *H01L 21/485* (2013.01); *H01L 21/76898* (2013.01); *G01R 31/3172* (2013.01); *G01R 31/31724* (2013.01)
USPC .................. 438/4; 438/15; 438/106; 438/109; 257/773; 257/777; 257/E21.576; 714/11; 714/30

(58) Field of Classification Search
CPC . H01L 21/485; H01L 21/76898; H01L 22/20; G01R 31/3172; G01R 31/31724
USPC .......... 438/4, 14, 15, 106, 109; 257/773, 777, 257/E21.576; 714/11, 30
See application file for complete search history.

(56) References Cited

U.S. PATENT DOCUMENTS

| | | | |
|---|---|---|---|
| 4,710,934 | A | 12/1987 | Traynor |
| 5,068,603 | A | 11/1991 | Mahoney |

(Continued)

FOREIGN PATENT DOCUMENTS

| | | |
|---|---|---|
| EP | 1 303 045 A2 | 4/2003 |
| JP | 05-136269 | 6/1993 |

(Continued)

OTHER PUBLICATIONS

Caterer, M.D. et al., "Processing thick multilevel polyimide films for 3-D stacked memory" IEEE Transactions on Advanced Packaging (May 1999) pp. 189-199, vol. 22, Issue: 2.

(Continued)

*Primary Examiner* — Michael Trinh
(74) *Attorney, Agent, or Firm* — Scully, Scott, Murphy & Presser, P.C.; William Stock, Esq.

(57) ABSTRACT

In one aspect, a method of enhancing semiconductor chip process variability and lifetime reliability through a three-dimensional (3D) integration applied to electronic packaging is disclosed. Also provided is an arrangement for implementing the inventive method. In another aspect, a method and on-chip controller are disclosed for enhancing semiconductor chip process variability and lifetime reliability through a three-dimensional (3D) integration applied to electronic packaging. Also provided is an on-chip reliability/variability controller arrangement for implementing the inventive method. In yet another aspect, base semiconductor chips, each comprising a plurality of chiplets, are manufactured and tested. For a base semiconductor chip having at least one non-functional chiplet, at least one repair semiconductor chiplet is vertically stacked. A functional multi-chip assembly is formed, which provides the same functionality as a base semiconductor chip in which all chiplets are functional.

24 Claims, 11 Drawing Sheets

(56) References Cited

U.S. PATENT DOCUMENTS

| | | | |
|---|---|---|---|
| 5,089,862 A | 2/1992 | Warner, Jr. et al. | |
| 5,414,637 A | 5/1995 | Bertin et al. | |
| 5,441,834 A | 8/1995 | Takekuma et al. | |
| 5,506,499 A | 4/1996 | Puar | |
| 5,524,115 A | 6/1996 | Kim | |
| 5,598,341 A | 1/1997 | Ling et al. | |
| 5,696,943 A | 12/1997 | Lee | |
| 5,915,167 A | 6/1999 | Leedy | |
| 5,917,763 A | 6/1999 | Mullarky | |
| 5,959,928 A | 9/1999 | Oh et al. | |
| 6,075,381 A | 6/2000 | LaBerge | |
| 6,208,545 B1 | 3/2001 | Leedy | |
| 6,552,947 B2 | 4/2003 | Longwell et al. | |
| 6,680,212 B2 * | 1/2004 | Degani et al. | 438/14 |
| 6,737,675 B2 | 5/2004 | Patel et al. | |
| 6,812,557 B2 | 11/2004 | Matsuo et al. | |
| 6,842,387 B2 | 1/2005 | Kang | |
| 6,876,594 B2 | 4/2005 | Griesmer et al. | |
| 6,881,994 B2 | 4/2005 | Lee et al. | |
| 6,928,590 B2 | 8/2005 | Ilkbahar et al. | |
| 6,965,249 B2 | 11/2005 | Lane et al. | |
| 6,967,881 B2 | 11/2005 | Sasaki et al. | |
| 7,030,651 B2 | 4/2006 | Madurawe | |
| 7,053,470 B1 * | 5/2006 | Sellers et al. | 257/678 |
| 7,054,206 B2 | 5/2006 | Tellier | |
| 7,064,579 B2 | 6/2006 | Madurawe | |
| 7,085,182 B2 | 8/2006 | Collura et al. | |
| 7,129,538 B2 | 10/2006 | Lee et al. | |
| 7,185,225 B2 | 2/2007 | Sutardja et al. | |
| 7,200,822 B1 | 4/2007 | McElvain | |
| 7,203,842 B2 | 4/2007 | Kean | |
| 7,253,659 B2 | 8/2007 | Madurawe | |
| 7,277,346 B1 | 10/2007 | Rahim et al. | |
| 7,287,177 B2 * | 10/2007 | Bonaccio et al. | 713/502 |
| 7,308,669 B2 | 12/2007 | Buehler et al. | |
| 7,730,349 B2 * | 6/2010 | Sutardja et al. | 714/11 |
| 2003/0057564 A1 | 3/2003 | Leedy | |
| 2003/0193076 A1 | 10/2003 | Patti | |
| 2004/0222817 A1 | 11/2004 | Madurawe | |
| 2005/0127490 A1 | 6/2005 | Black et al. | |
| 2006/0001176 A1 | 1/2006 | Fukaishi et al. | |
| 2006/0179417 A1 | 8/2006 | Madurawe | |
| 2007/0055845 A1 | 3/2007 | Sutardja et al. | |
| 2007/0152708 A1 | 7/2007 | Madurawe et al. | |
| 2007/0226556 A1 | 9/2007 | Fong et al. | |
| 2008/0083977 A1 | 4/2008 | Haba et al. | |
| 2008/0215802 A1 | 9/2008 | Chow et al. | |
| 2008/0229026 A1 | 9/2008 | Chung | |
| 2008/0308946 A1 * | 12/2008 | Pratt | 257/777 |
| 2009/0015322 A1 * | 1/2009 | Flautner et al. | 327/565 |
| 2009/0085217 A1 | 4/2009 | Knickerbocker et al. | |
| 2009/0115042 A1 | 5/2009 | Koyanagi | |
| 2009/0172288 A1 | 7/2009 | Sukegawa | |

FOREIGN PATENT DOCUMENTS

| | | |
|---|---|---|
| JP | 2001-243787 | 9/2001 |
| WO | 2005119776 A1 | 12/2005 |

OTHER PUBLICATIONS

Davis, J.A. et al., "Interconnect Limits on Gigascale [3D] Integration (GSI) in the 21st Century" url = citeseer.ist.psu.edu/498640.html, Proceedings of the IEEE, vol. 89, No. 3, Mar. 2011, 20 pages.

Gupta, S., et al., "Techniques for Producing 3D ICs with High-Density Interconnect" Proceedings of the 21st International VLSI Multilevel (2004)—tachyonsemi.com.

Liu, Y. et al., "Optoelectronic [3D] integration of polymer waveguide array and metalsemiconductor-metal photodetector through micromirror couplers" IEEE Photonics Technology Letters (Apr. 2001) pp. 355-357, vol. 13, Issue 4.

Matuso, S. et al., "Novel technology for hybrid [3D] integration of photonic and electronic circuits" IEEE Photonics Technology Letters (Nov. 1996) pp. 1507-1509, vol. 8, Issue: 11.

Wen, S. et al., "Finite-element modeling of thermal and thermomechanical behavior for threedimensional [3D] packaging of power electronics modules" Thermal and Thermomechanical Phenomena in Electronic Systems May 23-26, 2000) pp. 303-309, vol. 2.

Awasthi, M. et al., "Exploring the Design Space for 3D Clustered Architectures" URL: http://pac2.org. School of Computing, University of Utah {manua, rajeev}@cs.utah (Oct. 2006), 10 pages.

Franzon, P.D. et al., "Design for 3D Integration and Applications" Signals, Systems and Electronics (Jul. 30-Aug. 2, 2007) pp. 263-266.

Kim, J. et al., "Multi-flip chip on lead frame overmolded IC package: a novel packaging design to achieve high performance and cost effective module package" Proceedings of the 55th Electronic Components and Technology Conference (May 31-Jun. 3, 2005) pp. 1819-1821, vol. 1.

Mathewson, A. et al., "The design and fabrication of a 3D smart motor controller in ZMR material" IEEE Proceedings of SOS/SOI Technology Workshop (Oct. 3-5, 1988) pp. 67.

Yano, M. et al., "Optical MEMS for photonic switching-compact and stable optical crossconnect switches for simple, fast, and flexible wavelength applications in recent photonic networks" IEEE Journal of Selected Topics in Quantum Electronics (Mar.-Apr. 2005) pp. 383-394, vol. 11, Issue 2.

"Samsung Electronics Develops New, Highly Efficient Stacking Process for DRAM" 2 pages dated Mar. 12, 2010 http://physorg.com/news96826756.html (Apr. 26, 2007).

* cited by examiner

| Domain 510 | Options 520 | Replica Available 530 | Activation List 540 | Target IPC, Fclk 550 | Rerouting Path 560 | Power Overhead 570 |
|---|---|---|---|---|---|---|
| Region A | - | Y | A | 100% - fclk | TSV.A.TSV | 0% |
| Region B | 1 | N | A,D,Programmable logic | 80% - 0.8fclk | TSV.A.D.Prg.TSV | 2% |
| Region B | 2 | N | A,C,D,E,Programmable | 120% - 0.8fclk | TSV.A.C.D.E.Pr.TSV | 10% |
| ... | | | | | | |
| Region X,Y | | | | | | |

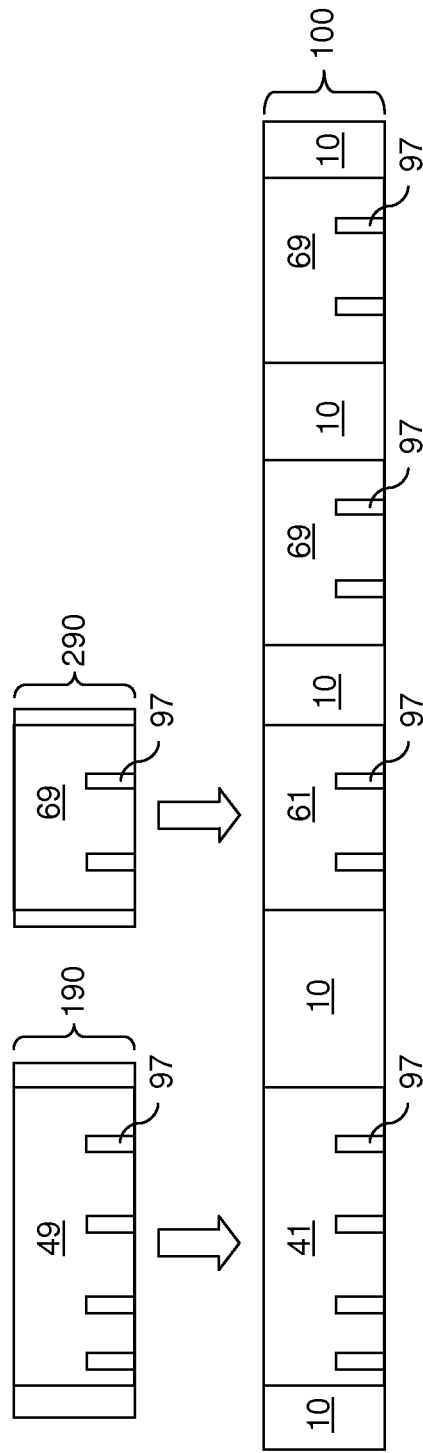
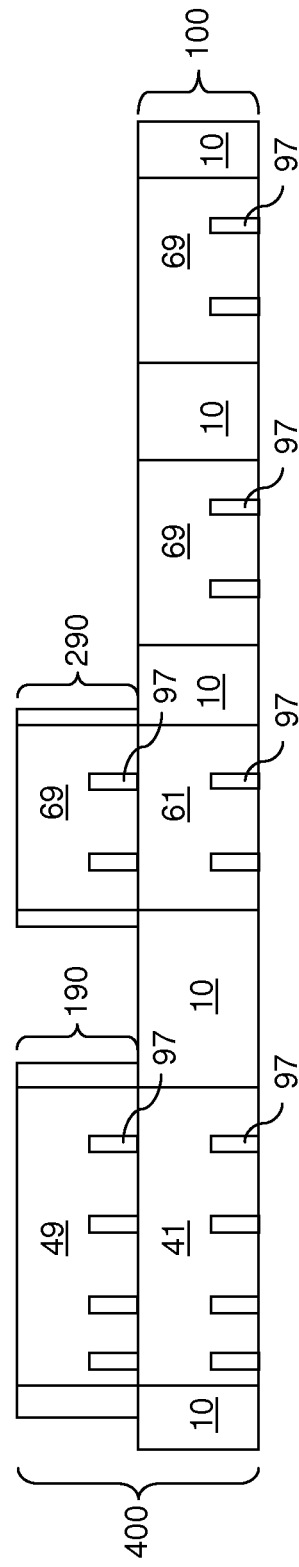
Figure 8A
Figure 8B

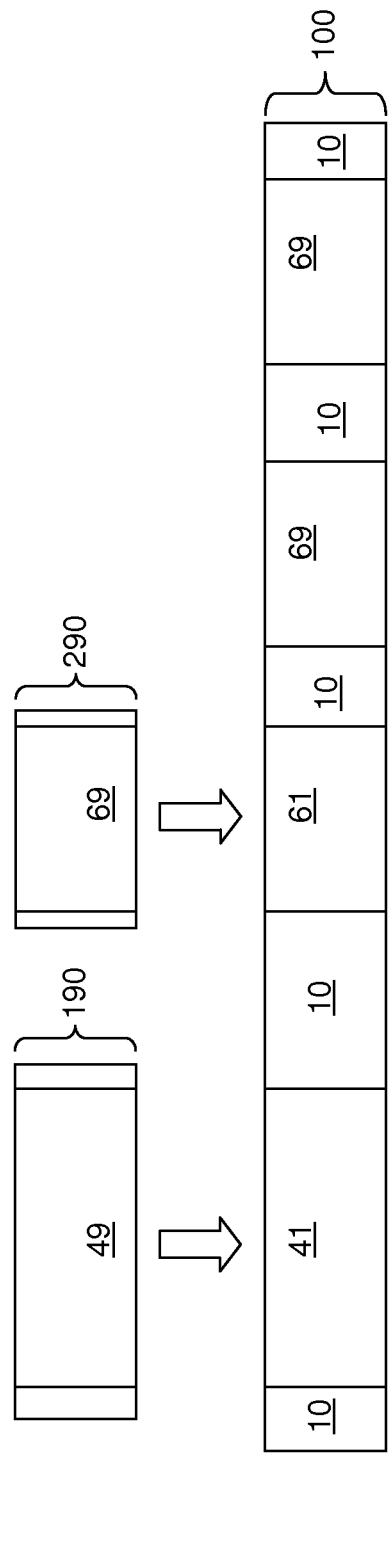
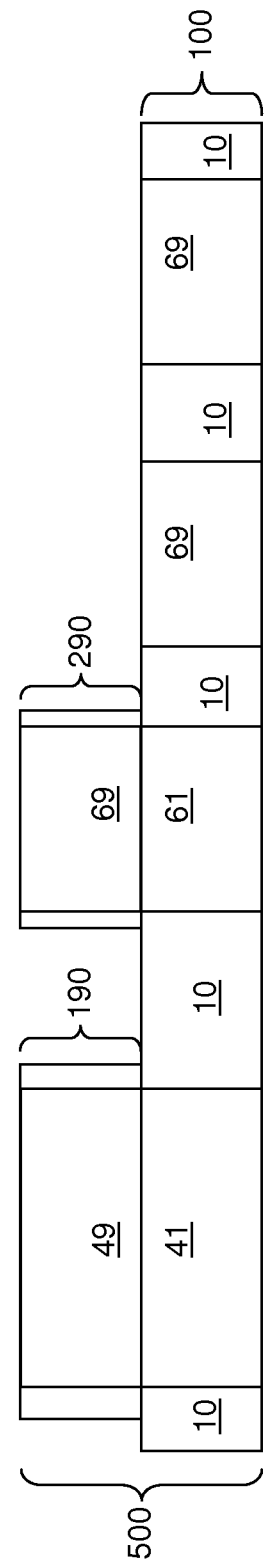
Figure 9A
Figure 9B

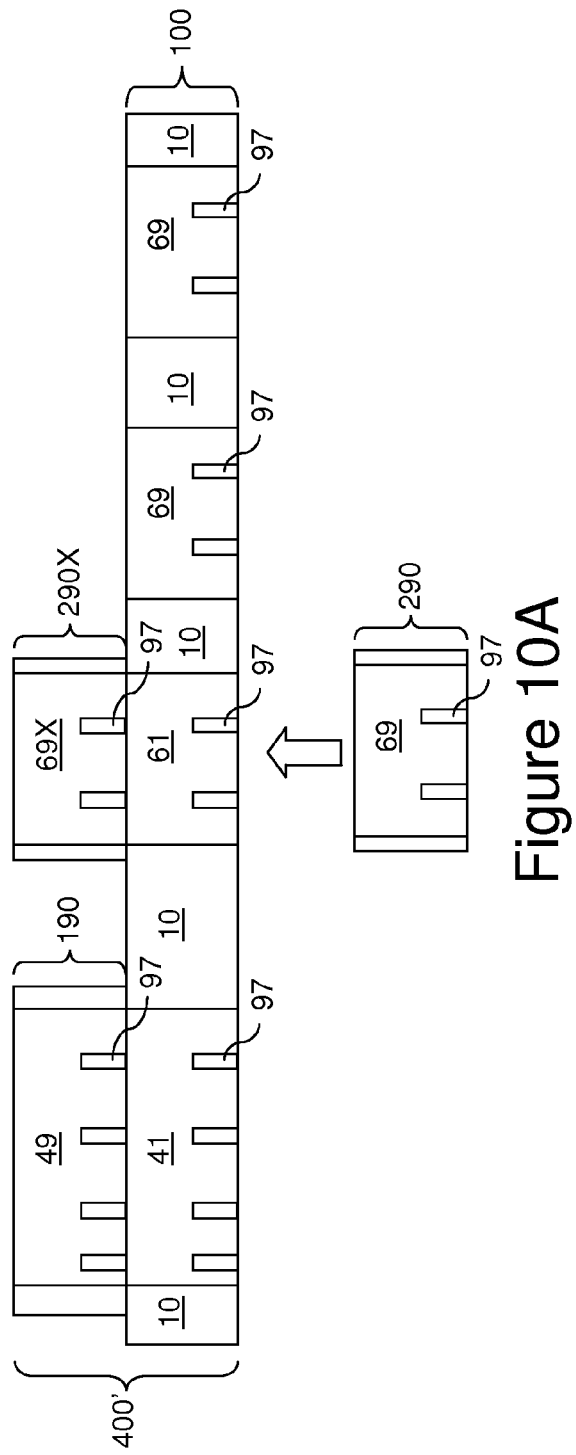
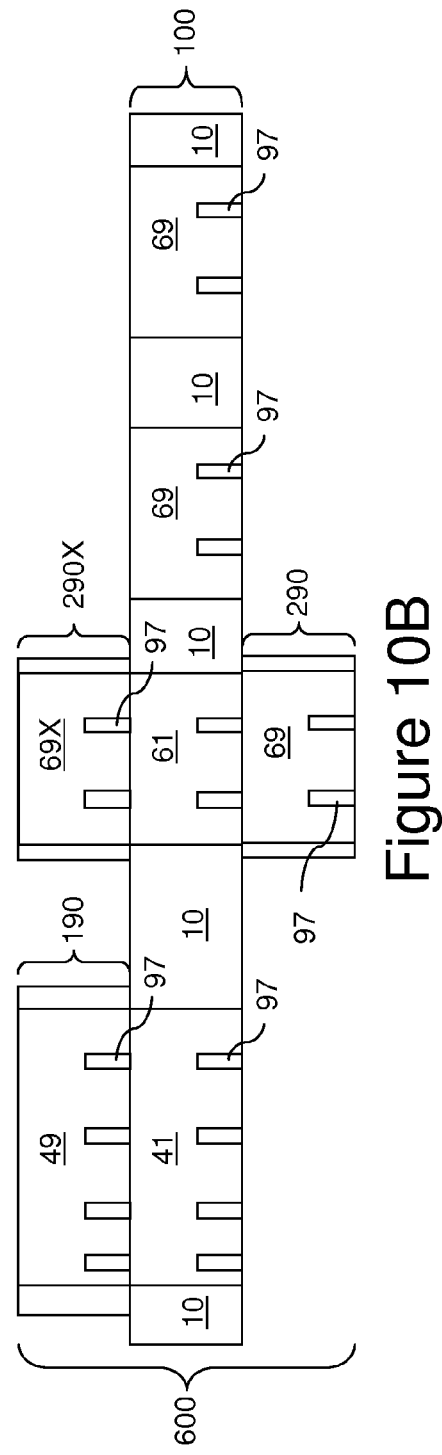
Figure 10A
Figure 10B

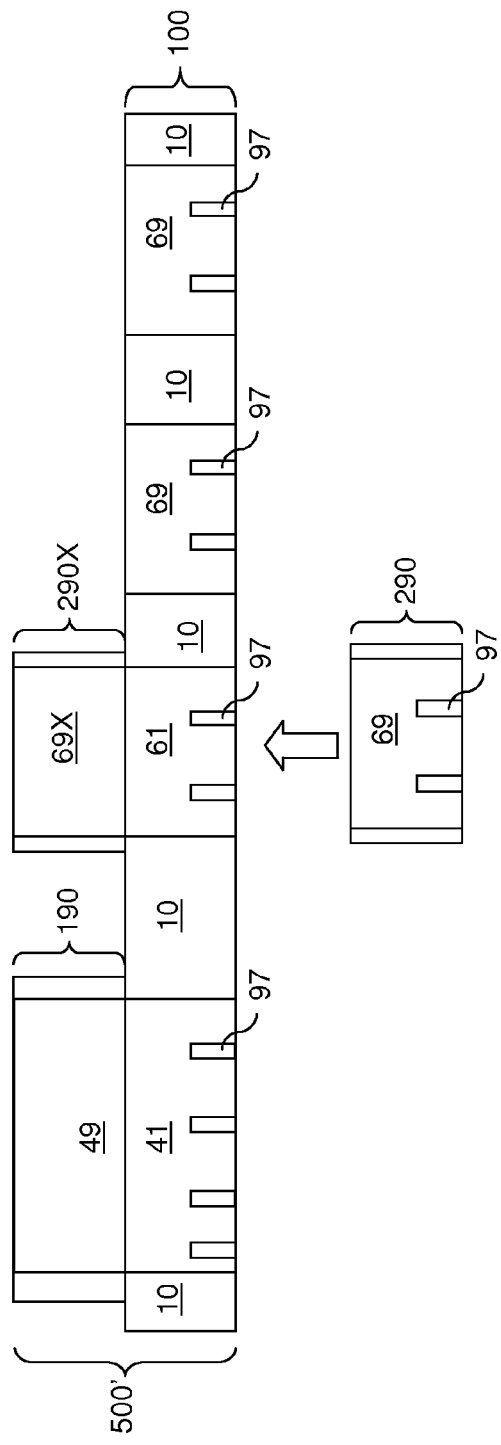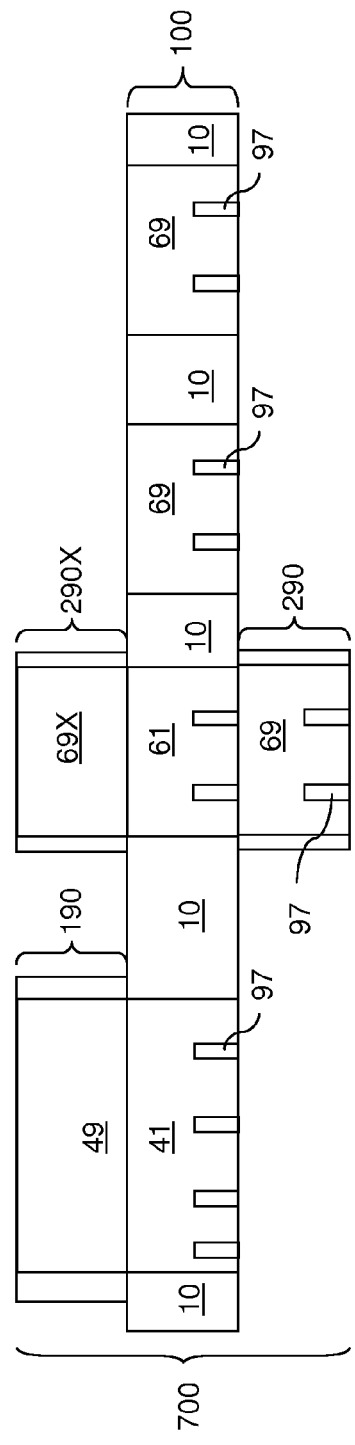
Figure 11A
Figure 11B

SEMICONDUCTOR CHIP REPAIR BY STACKING OF A BASE SEMICONDUCTOR CHIP AND A REPAIR SEMICONDUCTOR CHIP

CROSS REFERENCE TO RELATED APPLICATION

This application is a divisional of U.S. patent application Ser. No. 12/174,198, filed Jul. 16, 2008, which is a continuation-in-part of, is related to, and claims the benefit of priority from, invented-by-the-same-inventors and commonly assigned U.S. applications with Ser. No. 11/947,207, filed on Nov. 29, 2007 and now abandoned, and Ser. No. 11/948,376, filed on Nov. 30, 2007 and now abandoned. The contents of U.S. applications with Ser. Nos. 11/947,207 and 11/948,376 are expressly incorporated herein. The present application is also related to a commonly assigned and co-pending U.S. application with Ser. No. 12/041,878 filed on Mar. 4, 2008, the contents of which are incorporated herein by reference.

FIELD OF THE INVENTION

The present invention relates to a method for enhancing semiconductor chip process variability and lifetime reliability through three-dimensional (3D) integration and an arrangement for implementing the inventive method, and a control method and on-chip controller for enhancing semiconductor chip process variability and lifetime reliability through the intermediary of three-dimensional (3D) integration. Further, the present invention generally relates to semiconductor structures, and particularly to a multi-chip stacked semiconductor structure providing improvement in yield and methods of manufacturing the same.

BACKGROUND

Increased requirements in power density and technology scaling for electronic package components have encountered considerably increased existing reliability problems in recent years, as a result of which lifetime reliability and process variation has already been elevated to the "critical challenges" category according to ITRS 2005 in the technology.

Chip lifetime reliability has traditionally been ensured through process qualification and sorting out of defective chips through accelerated degradation techniques like process burn-in. The utilization of structural duplication is considered as another standard technique for dealing with lifetime reliability issues; however, the corresponding required overhead in terms of increased cost, manufacturing area and complexity, generally limits the extent of applicability_thereof in practice. Similarly, the traditional burn-in process that is used to accelerate extrinsic failures is reaching a point where it is raising a number of complications and is becoming more difficult to implement with each successive process generation. In some instances, burn-in is believed to cause lifetime reliability problems itself, as a result of which, there has been an increased degree of interest in developing alternative techniques for improving the chip lifetime reliability without the burn-in process in recent years.

There is a significant amount of cost associated with the process variation in technologies, especially at levels of 32 nm and below. Lost yield due to process variability causes millions of dollars in wasted expenditures every year per production line. There is significant cost and problems associated with lost yield due to process variation in current and next generation technologies. These include timing and associated functionality problems, performance reduction due to the timing changes, increase in chip footprint due to the additional blocks, ability to handle only single fault and single type of fault due to lack of intelligence in the current approaches to dealing with variability.

In order to provide clear advantages over the current state of the technology, in accordance with the invention, there is proposed a technique that is adapted to alleviate lifetime reliability and process variability issues through the intermediary of three-dimensional (3D) integration. Even though the motivation for 3D integration has been largely interconnect-driven and packaging-oriented, 3D integration can provide further broader advantages when effectively utilized.

Chip yield, which is the fraction of functional chips among all manufactured chips, is a key factor in determining chip cost. From a manufacturing point of view, per-wafer production cost of semiconductor chips cannot be lowered below a certain level. Since the total production cost must be recouped from the sale of functional chips, a low chip yield invariably drives up the unit cost of the chip.

State-of-the-art semiconductor chips that provide superior performance often run into a high production cost due to low chip yield. This is because state-of-the-art semiconductor chips, in order to deliver superior performance than more common economical chips, tend to utilize a large chip area as well as aggressively scaled lithographic dimensions and processing techniques that have not fully matured or stabilized. Thus, the more aggressive the unit process technology employed in manufacturing a chip, and the larger the area of the chip, the lower the chip yield and the higher the cost of the chip.

In order to improve chip yield, redundancy repair components are often fabricated on a chip. This is almost universally done for array structures such as dynamic random access memory (DRAM) arrays and static random access memory (SRAM) arrays. Incorporation of redundant rows or redundant columns is easy to implement in an array structure.

For logic blocks, redundancy is much harder to implement since components of logic blocks are much less repetitive. Prediction of a high failure rate area is mostly a futile exercise since most of the logic block components have insignificant failure rates. Thus, building redundancy for logic blocks is much less effective than for an array structure, as well as requiring much more area than redundancy repair components for the array structure. In other words, the area penalty associated with building redundancy repair components for logic blocks is unacceptably high.

Normal chips containing multiple processor cores on a semiconductor substrate could include extra processor cores for redundancy repair to improve yield. However, the total area of the extra processor core including the areas of caches and bus interconnect logic circuits is substantial for each extra processor core. Further, considering that the caches and the bus interconnect logic circuits typically have a high yield, the areas occupied by the caches and the bus interconnect logic circuits are wasted area that typically does not contribute to improved yield yet increases the total chip area.

Further, design requirements typically call for a number of processor cores that is a power of two, i.e., 2, 4, 8, etc., which typically fits into natural floor planning pattern for chips. Adding extra processor cores for redundancy repair generally breaks this natural floor planning pattern. For these reasons, addition of extra processor cores into a semiconductor chip is, in general, problematic.

However, providing a mechanism for repairing a chip has grown in importance since the number of processor cores per chip continues to increase. "All good chips" in which all processor cores are functional becomes more challenging with the increase in the number of processor cores.

In view of the above, there exists a need to provide improved yield to a semiconductor chip having multiple processor cores.

Specifically, there exists a need to provide a structure having a repair capability to semiconductor chips having multiple processor cores and methods of manufacturing the same.

SUMMARY

According to one aspect of the present disclosure, in order to implement the foregoing, there is provided a method for enhancing the lifetime reliability and process variability through effective use of three-dimensional integration technology. An auxiliary so-called healing layer is attached to an original processor die through 3D integration. This one-fits-all auxiliary layer can solve any reliability or variability problem automatically at run time, and preserves the synchronous timing while potentially improving the performance of a faulty chip compared to the baseline. More extensively, proposed is an intelligent on-chip controller which manages the redundancy in the auxiliary layer, including exact replicas of number of critical blocks; generic and configurable logic resources; configurable wiring and high-bandwidth low-latency interconnect to the primary layer. The invention, thus, focuses on utilizing these resources through 3D integration in order to improve upon lifetime reliability and variability.

One primary aspect of the invention resides in utilizing the available 3D redundancy, by dynamically adjusting the processor resources on both layers, i.e., primary and device layers, simultaneously including logic and interconnectivity in order to bring the system to a state at which it can achieve at least the same or improved performance over the baseline. High-end server systems are good candidates for this "healing/compensating layer technique". Not only does the additional memory hierarchy in this layer provide performance improvement, the reconfigurable redundancy enables enhanced lifetime reliability in recovering from a wide range of faults.

According to another aspect of the present disclosure, the present invention is directed to providing an on-chip controller adapted to facilitate implementing a method to alleviate lifetime reliability and process variability issues through three-dimensional integration. Three-dimensional integration has shown significant potential for improving the integrated circuit design in the past years. Even though the motivations for 3D has been largely interconnect driven and packaging, 3D integration can provide further advantages if it is effectively utilized.

Concerning the foregoing, the invention is directed to a method for enhancing the lifetime reliability and process variability through effective use of three-dimensional integration technology. An auxiliary so-called healing layer is attached to an original processor die through 3D integration. This one-fits-all auxiliary layer can solve any reliability or variability problem automatically at run time, and preserves the synchronous timing while potentially improving the performance of a faulty chip compared to the baseline. Proposed is an intelligent on-chip controller which manages the redundancy in the auxiliary layer, including exact replicas of number of critical blocks; generic and configurable logic resources; configurable wiring and high-bandwidth low-latency interconnect to the primary layer. The invention, thus, focuses on utilizing these resources through 3D integration in order to improve upon lifetime reliability and variability, but not claiming the invention of an additional device layer or the hardware units in this layer.

The auxiliary or second device layer includes: (i) an on-chip reliability/variability controller, which is capable of monitoring on-chip resources, recovering from faults and process variability induced differences through activating/deactivating/configuring one or more of the logic or memory units or interconnect on the chip; (ii) exact replicas of critical blocks on the second layer (whereby both layers have matching floor plans, where the duplicates are located vertically on top of the originals), but not all units in a microprocessor are of equal criticality. Units such as register files, issue or fetch logic are of higher importance compared to caches and predictors, for which faults can be tolerated to a certain extent; (iii) generic logic, which is to be used as redundancy for various reconfigurable redundancy enables enhanced lifetime reliability recovering from a wide range of faults.

In one embodiment of the present disclosure, an on-chip method utilizing a controller for enhancing semiconductor chip process variability and lifetime reliability through a three-dimensional integration applied to electronic packaging is provided. The method includes:
  (a) providing a first semiconductor chip essentially consisting of a microprocessor, a plurality of performance and memory resources, including selectively functional units, control macros, elements of data flow, register files and memory arrays;
  (b) providing a second semiconductor chip in a superimposed arrangement over the first semiconductor chip, the second semiconductor chip including an on-chip controller and redundant resources actuatable upon recognition of a faulty resource or plurality of faulty resources on the first semiconductor chip;
  (c) configuring at least one of the redundant resources on the second semiconductor chip as a performance enhancer for at least one of the resources on the first semiconductor chip; and
  (d) incorporating redundancies on the second semiconductor chip thereon for critical macros on the first semiconductor chip selectively comprising vectors, fixed or floating point execution blocks, auxiliary pipelines and diverse component units.

The method can further include having an on-chip controller activate and rewire any encountered on-chip redundancy including configurable redundancies depending upon current malfunctions and/or faults in the semiconductor chip.

In another embodiment of the present disclosure, an on-chip controller arrangement for enhancing semiconductor chip process variability and lifetime reliability through a three-dimensional integration applied to electronic packaging. The arrangement includes:
  (a) a first semiconductor chip essentially consisting of a microprocessor, a plurality of performance and memory resources, including selectively functional units, control macros, elements of data flow, register files and memory arrays;
  (b) a second semiconductor chip being located in a superimposed arrangement over the first semiconductor chip, the second conductor chip including an on-chip controller and redundant resources actuatable upon recognition of a faulty resource or plurality of faulty resources on the first semiconductor chip;
  (c) at least one of the redundant resources on the second semiconductor chip being configured as a performance enhancer for at least one of the resources on the first semiconductor chip; and (d) redundancies on the second semiconductor chip being incorporated for critical macros on the first semiconductor chip selectively comprising vectors, fixed or floating point execution blocks, auxiliary pipelines and diverse component units.

In yet another embodiment, the on-chip controller activates and rewires any encountered on-chip redundancy including configurable redundancies depending upon current malfunctions and/or faults in the semiconductor chip.

According to yet another aspect, the present invention addresses the needs described above by providing a multi-chip semiconductor assembly in which loss of functionality through a defective chiplet within a base semiconductor chip is compensated for with a repair semiconductor chip providing the functionality of the chiplet, and methods of manufacturing the same.

In the present invention, base semiconductor chips, each comprising a plurality of chiplets, are manufactured and tested. For a base semiconductor chip having at least one non-functional chiplet, at least one repair semiconductor chiplet, which provides the same functionality as one of the at least one non-functional chiplet is designed to provide, is vertically stacked. The at least one repair semiconductor chiplet provides the functionality that the at least one non-functional chiplet is designed to provide to the base semiconductor chip. The defects in the functionality of the at least one non-functional chiplet are cured through the at least one repair semiconductor chiplet, and thus, a functional multi-chip assembly is formed, which provides the same functionality as a base semiconductor chip in which all chiplets are functional. In case a first attempt to repair the base semiconductor chip by stacking repair semiconductor chips is unsuccessful, additional repair semiconductor chips may be subsequently stacked to fully repair the base semiconductor chip.

According to the present invention, a method of forming a multi-chip assembly of semiconductor chips is provided, which comprises:

forming a base semiconductor chip comprising a plurality of chiplets including at least one non-functional chiplet;

forming at least one repair semiconductor chip, wherein each the at least one repair semiconductor chip includes a functional chiplet providing a same functionality as one of the at least one non-functional chiplet is designed to provide; and vertically stacking the at least one repair semiconductor chip on the base semiconductor chip to form a multi-chip assembly, wherein the multi-chip assembly provides a same functionality as the base semiconductor chip is designed to provide.

In one embodiment, the plurality of chiplets includes at least two of a processor core chiplet, a static random access memory (SRAM) chiplet, an embedded dynamic random access memory (eDRAM) chiplet, a cache memory chiplet, a non-volatile memory chiplet, a programmable gate array (PGA) chiplet, a peripheral circuitry chiplet, an input/output control chiplet, a built-in-self-test (BIST) chiplet, a memory controller chiplet, a power supply bus chiplet, a ground bus chiplet, and a signal bus chiplet.

In another embodiment, each of the functional chiplet in the repair semiconductor chip has substantially the same design layout as one of the at least one non-functional chiplet.

In even another embodiment, each of the functional chiplet comprises a set of through-substrate vias formed within a substrate, wherein the set of through-substrate vias provides electrical connection between the functional chiplet and the base semiconductor chip.

In yet another embodiment, each of the repair semiconductor chip consists of a functional chiplet having substantially the same design layout as one of the at least one non-functional chiplet.

In still another embodiment, a design layout of the each of the functional chiplet in the repair semiconductor chip is a minor image of a design layout of one of the at least one non-functional chiplet.

In still yet another embodiment, the base semiconductor chip and the at least one repair semiconductor chip are stacked back to back by C4 bonding which provides electrical connection between the functional chiplet and the base semiconductor chip.

In a further embodiment, each of the repair semiconductor chip consists of a functional chiplet having the mirror image of the design layout of one of the at least one non-functional chiplet.

In an even further embodiment, the method further comprises manufacturing and testing a plurality of base semiconductor chips, wherein the base semiconductor chip is identified when test data indicates that the at least one non-functional chiplet in the base semiconductor chip is non-functional.

In a yet further embodiment, at least two repair semiconductor chips are vertically stacked directly above and/or below a non-functional chiplet of the base semiconductor chip, wherein each of the at least two repair semiconductor chip includes a chiplet designed to provide a same functionality as the non-functional chiplet in the base semiconductor chip.

In a still further embodiment, one of the at least two repair semiconductor chips is stacked directly above the base semiconductor chip by C4 bonding, and wherein another of the at least two repair semiconductor chips is stacked below the base semiconductor chip by a set of through-substrate vias in a substrate of the base semiconductor chip.

In a further embodiment, the vertically stacked at least one repair semiconductor chip provides at least a fraction of functionality that the at least one non-functional chiplet is designed to provide.

In an even further embodiment, the vertically stacked at least one repair semiconductor chip provides more functionality than the functionality that the at least one non-functional chiplet is designed to provide.

BRIEF DESCRIPTION OF THE DRAWINGS

The foregoing is clearly emphasized by referring to the accompanying drawings. The inventive concept is illustrated on the parts and full integration of three-dimensional embodiments of an electronic package.

FIGS. 8A and 8B are sequential cross-sectional views illustrating formation of a first exemplary multi-chip assembly according to a first embodiment of the present invention.

FIGS. 9A and 9B are sequential cross-sectional views illustrating formation of a second exemplary multi-chip assembly according to a second embodiment of the present invention.

FIGS. 10A and 10B are sequential cross-sectional views illustrating formation of a third exemplary multi-chip assembly according to a third embodiment of the present invention.

FIGS. 11A and 11B are sequential cross-sectional views illustrating formation of a fourth exemplary multi-chip assembly according to a fourth embodiment of the present invention.

DETAILED DESCRIPTION OF THE INVENTION

Figure 1:
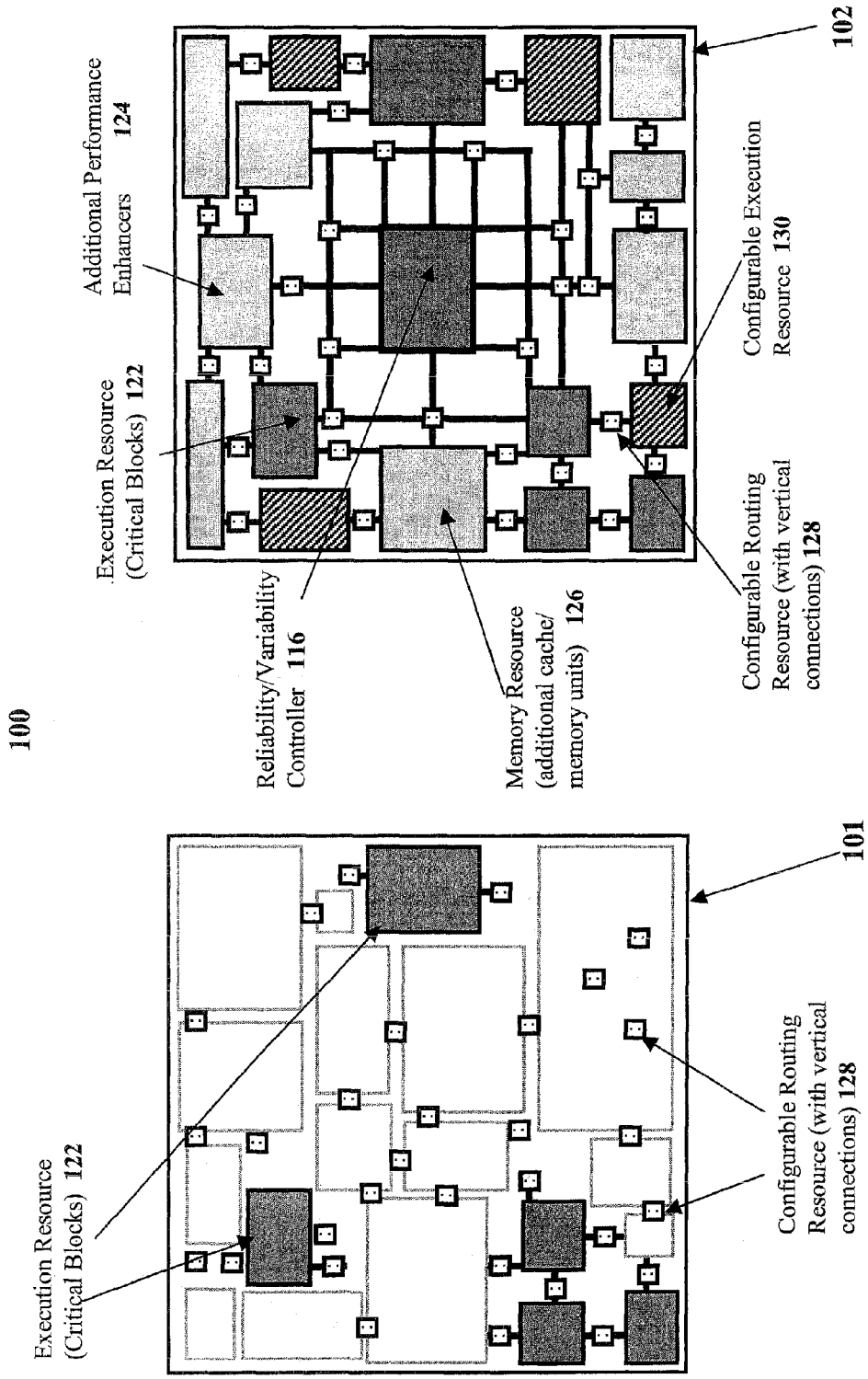
FIG. 1 shows a primary semiconductor chip and an auxiliary (or secondary) semiconductor chip for incorporation into a three-dimensional semiconductor chip. The auxiliary chip incorporates duplicated resources along with the regular logic.

As stated above, the present invention relates to a method for enhancing semiconductor chip process variability and lifetime reliability through three-dimensional (3D) integration and an arrangement for implementing the inventive method, and a control method and on-chip controller for enhancing semiconductor chip process variability and lifetime reliability through the intermediary of three-dimensional (3D) integration, and a multi-chip stacked semiconductor structure providing improvement in yield and methods of manufacturing the same, which are now described in detail with accompanying figures. As used herein, when introducing elements of the present invention or the preferred embodiments thereof, the articles "a", "an", "the" and "said" are intended to mean that there are one or more of the elements. Throughout the drawings, the same reference numerals or letters are used to designate like or equivalent elements. Detailed descriptions of known functions and constructions unnecessarily obscuring the subject matter of the present invention have been omitted for clarity. The drawings are not necessarily drawn to scale.

As used herein, a "chiplet" denotes a subset of a semiconductor chip of integral construction. A semiconductor chip includes at least one chiplet, and may contain a plurality of chiplets. A chiplet is a functional unit of a semiconductor chip, and is typically provided with an edge seal within the semiconductor chip and occupies a dedicated area of the semiconductor chip without overlapping with any other chiplet.

Pursuant to the method for enhancing lifetime reliability and/or performance that uses 3D integration, there are employed at least two chips where the first chip is a microprocessor. The second chip consists of a set of execution/memory resources configurable as either redundant resource for the microprocessor and microcontroller for managing and reconfiguring the resources in response to detection of a need for replacing a resource in the first chip in a sequence of steps where as a first step the pool of existing execution or memory resources is scanned to find an eligible replacement for the resource marked for replacement. If the eligible resource is not available, one of the reconfigurable resources is configured to replace the resource that is marked for replacement. Hereby, one or more of the execution/memory resources in the second chip is configured to work as a performance enhancer for one of the resources in the first chip (such as a second pipeline in the auxiliary device layer).

Referring in detail to FIG. 1 of the drawings, a diagrammatic implementation 100 of the basic components of this invention is presented: a floor plan of a primary semiconductor chip 101 and an auxiliary (or secondary) semiconductor chip 102.

The primary chip or layer 101 may be a regular two-dimensional semiconductor microprocessor chip, with additional and necessary resources for 3D chip integration. The resources in the first chip may be complete processor cores, functional units, control macros, elements of the processor dataflow, register files, memory arrays, whereby there is also provided in the auxiliary (or secondary) chip, redundancy for critical macros, such as vector, fixed or floating point execution blocks, auxiliary pipelines, accelerator cores, as well as generic configurable logic such as filed programmable gate arrays and programmable logic macros, wherein the custom macros are embedded in the configurable fabric thereof. In the drawing of FIG. 1 of the primary chip 101, we only highlight on-chip blocks or structures 122, 128 which may have exact replicas on the secondary layer chip 102.

The auxiliary device layer or chip 102 includes: (i) On-chip reliability/variability controller 116: capable of monitoring on-chip resources, recovering from faults and process variability induced differences through activating/deactivating/configuring one or more of the logic or memory units or interconnect on the chip; (ii) Exact replicas of critical blocks 122 on the first/primary chip layer, whereby both layers 101, 102 have matching floor plans, where the duplicates are located vertically on top of the originals. However, not all units in a microprocessor are of equal criticality. Units such as register files, issue or fetch logic are of higher importance compared to cache memory and other prediction structures whose faults can be tolerated to a certain extent; (iii) Generic logic 130: for use as redundancy for various faults (lookup tables of configurable sizes, stacks); (iv) Configurable logic 130: for use for multiple purposes (configured by the on-chip controller); (v) Configurable interconnect 128 (lateral and vertical) and switch boxes: for connecting/disconnecting the replica or original blocks as well as using the generic or configurable logic blocks; and (vi) Additional memory elements 126 (SRAM, DRAM, eDRAM) and other structures 124 for performance improvement.

Figure 2:
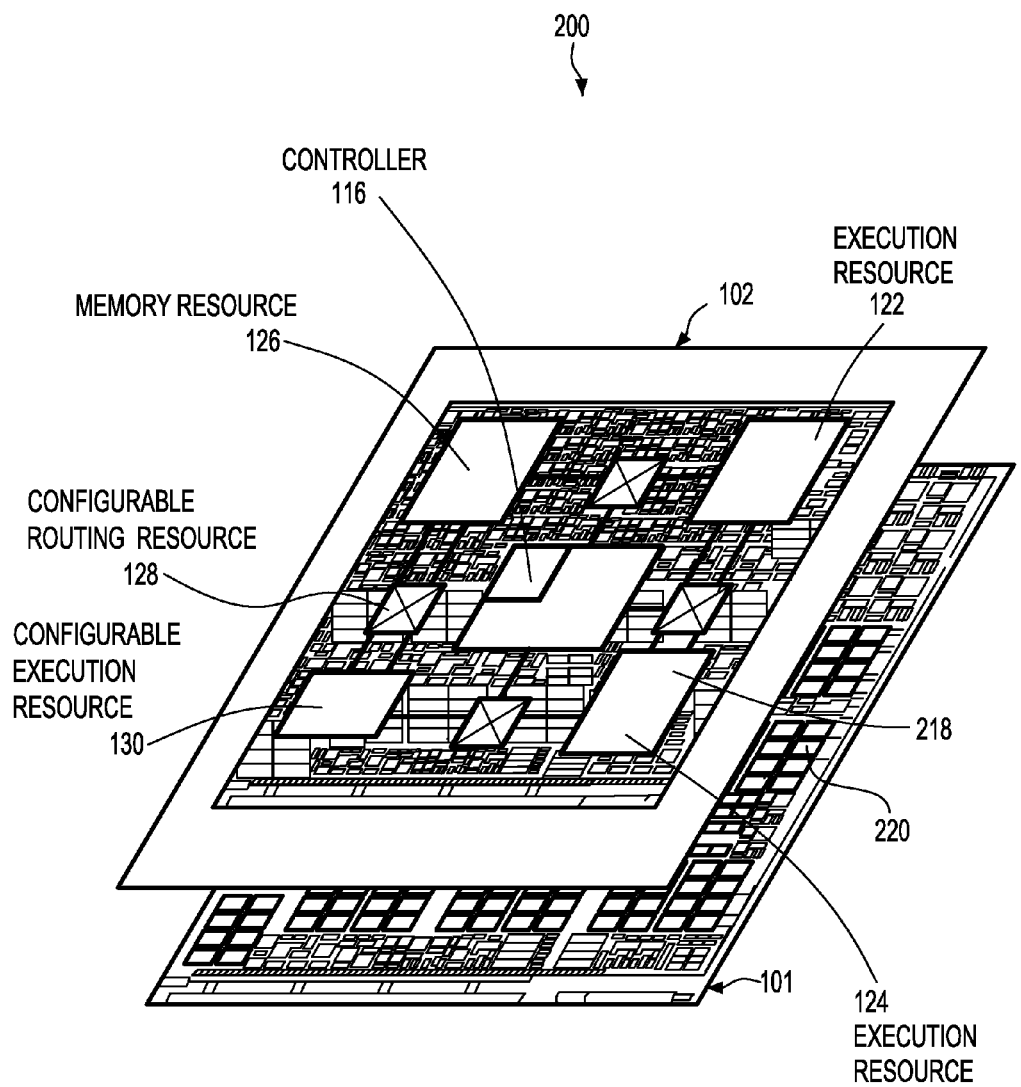
FIG. 2 illustrates, generally diagrammatically, an embodiment of superimposed semiconductor chip layers for effectuating the three-dimensional integration process.

Referring now in detail to FIG. 2 of the drawings, the concept is represented on a 2-layer 3D embodiment 200, having first and second layers 101, 102. The second device layer 102 includes an on-chip variability/reliability controller 116, as well as redundant resources 218 that can be activated if a primary unit 220 in the first device layer 101 is faulty. The on-chip controller 116 activates any idle blocks while inactivating (turning off and by-passing) faulty units. Moreover, it includes performance-enhancing resources 122, 124, 126, 128, 130, additional cache/memory hierarchy such as DRAM or SRAM as well as monitoring and recovering capabilities.

The connection between the primary copy of a block and the redundancy which is placed on the top layer 102 may be achieved through vertical interconnects 128, such as TSVs (through-the-silicon-vias). The configurable interconnect 128 can be adjusted to connect either copy of the fault domains to the rest of the chip in case of a fault. This configuration is achieved through the use of switch boxes or multiplexers (not shown).

The floor plans of the primary and secondary chip layers 101, 102 match in terms of critical block placement, such that for critical blocks the replicas in the secondary chip 102 are located on top of the primary units in the primary chip 101. This approach provides significant reduction in the interconnect length and latency. As the distances between 2 device layers can be 20-50 um in the current 3D integration, the vertical delay between the original and the redundant unit is less than FO4. Hence, the synchronous timing is preserved. Also, asynchronous cases are easily handled with the same scheme.

Figure 3:
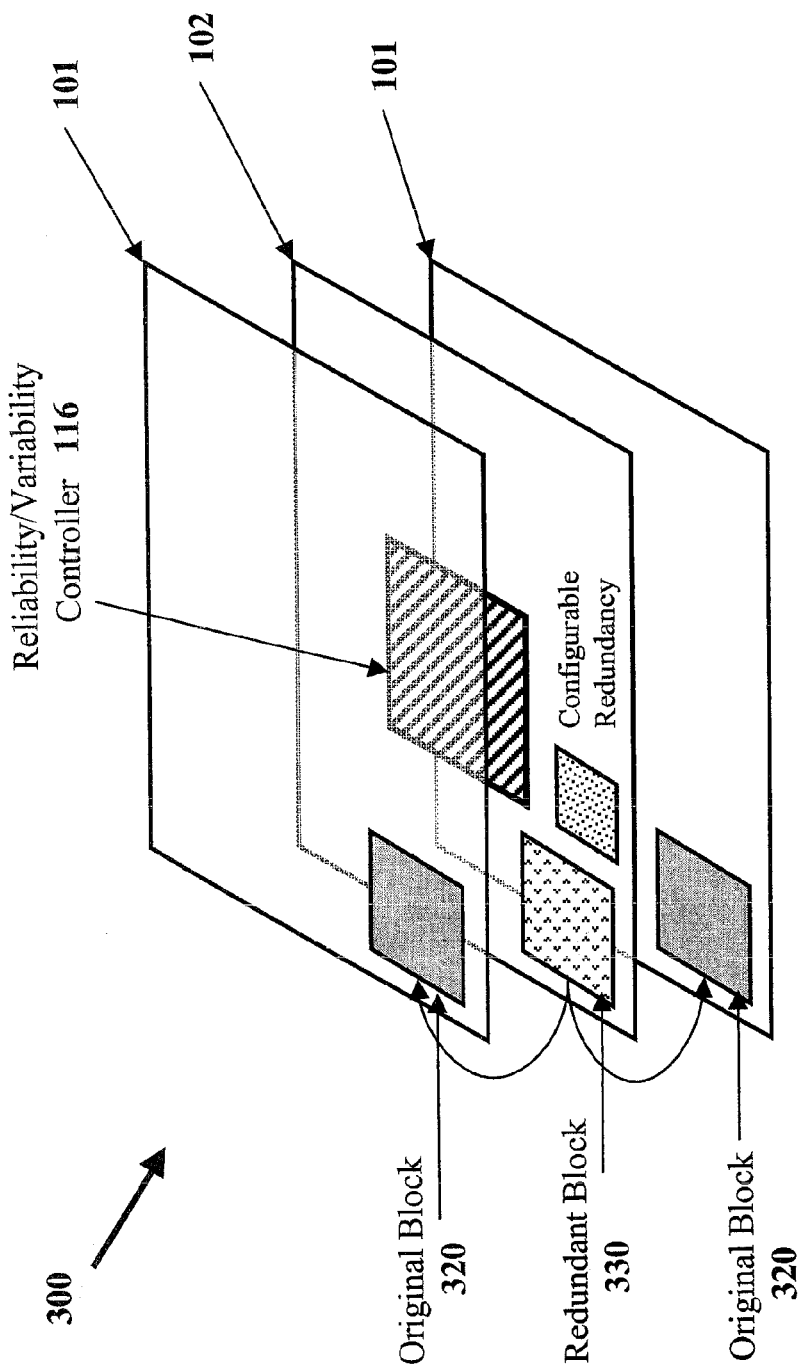
FIG. 3 illustrates another embodiment of the invention wherein an auxiliary semiconductor chip is placed in the middle of two primary semiconductor chips forming a S-layer three-dimensional semiconductor chip.

Referring now in detail to FIG. 3 of the drawings, the inventive concept is further represented on a 3-layer 3D embodiment 300, having first 101, second 102 and third 101 layers. In this embodiment, one auxiliary (or secondary) chip 102 is stacked in between two primary chips 101. The second device layer 102 includes an on-chip variability/reliability controller 116, as well as a configurable and custom redundant resource 330 that can be activated and dynamically assigned to either of the primary chips 101 if a primary unit 320 in either of the primary device layers 101 becomes faulty during system runtime. Also, if the primary units 320 in both primary chips 101 become faulty, the configurable redundant resource 330 on the secondary chip 102 can be used to replace both, albeit at a reduced system performance.

Figure 4:
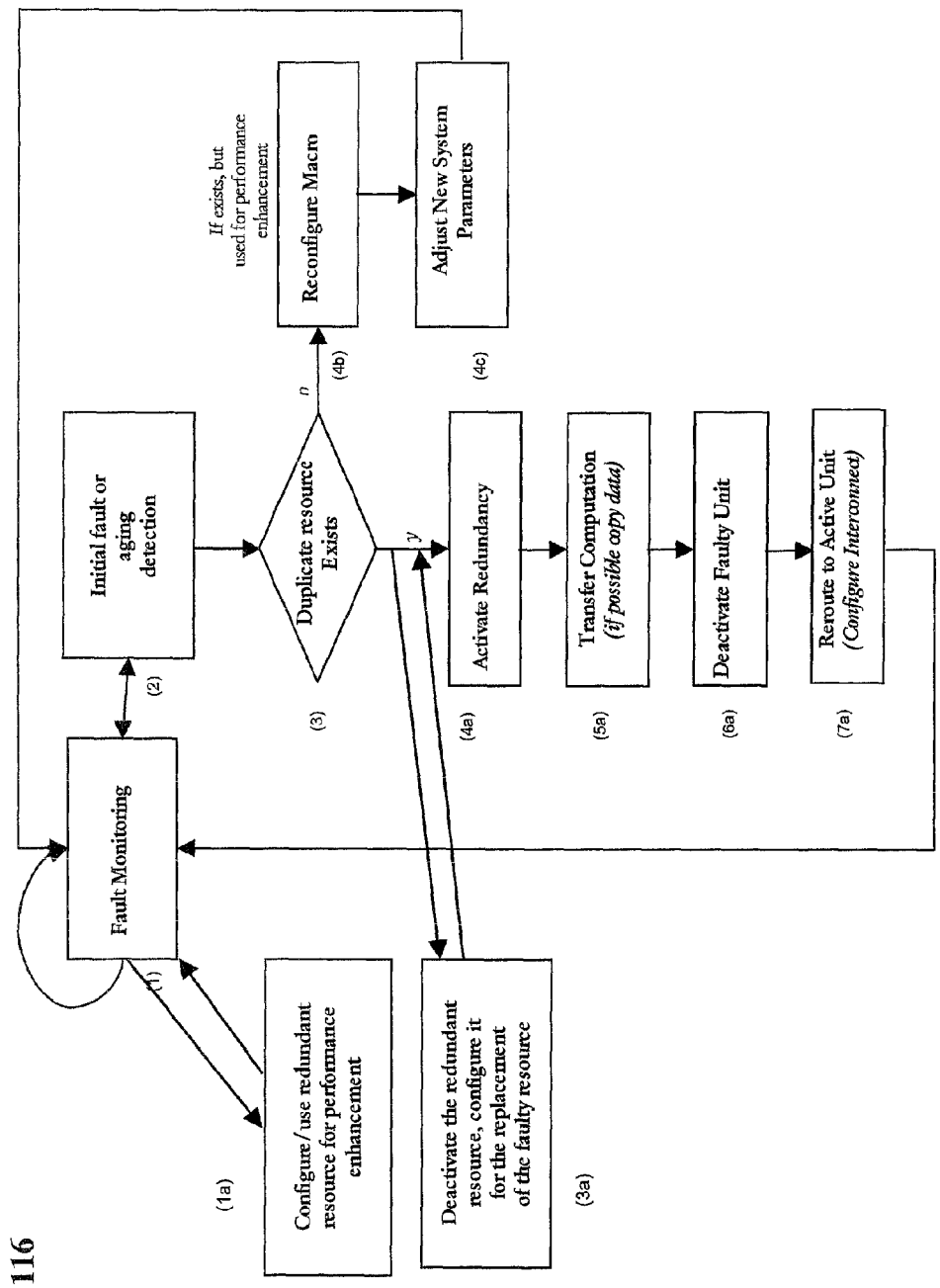
FIG. 4 illustrates a flow chart explanatory of the on-chip controller functions.

The additional device layer 102 includes the reliability/variability controller 116, with high-bandwidth and low-latency access to the rest of the chip. The reliability/variability controller 116 performs regular checks on the existing hardware in order to detect potential faults as in the flow chart of FIG. 4. When a fault is detected, the controller 116 then uses the pre-programmed recovery schemes 500, like the example shown in FIG. 5, to recover from the fault. Recovery schemes can be implemented as a lookup table with the manufacturers preset recovery schemes. Each recovery scheme indicates precisely how to recover from specific faults using the existing redundancy in the second device layer. In the cases that the exact replica of the faulty unit is not available, the controller uses configurable hardware blocks such as programmable logic arrays for emulating the desired functionality. The auxiliary device layer also includes configurable routing, additional cache hierarchy in the form of SRAM or DRAM, configurable logic blocks and ASIC macros.

On-chip recovery schemes compensate for the changes in the configurable logic timing in general, which creates major problems in maintaining the same synchronous timing. The on-chip reliability/variability controller recovery scheme adjusts the clock frequency in both the first and second layers so that the two layers can still be synchronous.

The on-chip reliability/variability controller 116 may select from a number of preset recovery schemes 500 depending on a number of conditions including: the power overhead of a recovery scheme, the current power saving mode, the frequency target for both layers, severity of fault, and current workload demand. It is notable that the recovery scheme can be changed in time, when one or more of these conditions change. For instance: the reliability/variability controller may opt for a high-performance high-overhead recovery scheme when the workload demand is high. Later when the workload demand drops, this recovery scheme is deactivated and a low-power low-overhead scheme is used. This way the controller 116 makes efficient use of the on-chip resources even for fault recovery or variability issues.

The reliability/variability controller 116 monitors the devices in both the first and second layer for variability problems as well as lifetime reliability problems. Variability problems can be of static or dynamic nature, as follows:

For static variability problems such as atomic dopant variations, lithographic variations etc.; the controller assesses the variability by checking the performance, power and temperature of units on the processor. In these cases, number of cores may have inherently higher leakage power dissipation and temperatures (due to lower $V_{th}$ for instance). The cores affected by process variability are specially treated by the on-chip controller 116 in terms of clock frequency settings, compensating for the increased temperatures etc.

For other cases where the variability issues change in time, such as NBTI (Negative Bias Temperature Shifts) problems, the controller performs constant checks at regular intervals to detect these at runtime, as well as compensating for these problems as they occur.

Figure 5:
FIG. 5 shows the recovery schemes of the controller.

The on-chip controller 116 may include a lookup table 500 as shown in FIG. 5 with various recovery schemes for different types of faults. These schemes are provided and programmed by the manufacturer for each fault in the critical parts of the process. The schemes include information about:

Replica availability 530: Whether the exact replica for the custom block is available at the top/bottom layer. This makes the recovery much simpler by activating the needed replica only.

Options 520: Whether there are multiple recovery options possible. In some cases, there are various ways of recovering from the fault. However, each solution varies in terms of resulting performance, power dissipation, routing overhead etc. The controller is provided with this information so that it can select between different schemes depending on the operating conditions: such as workload demand, power dissipation restrictions, and performance constraints. Later when the conditions change, the controller can dynamically choose another scheme to activate with more desirable characteristics for the new conditions. (For instance, if the workload demand is high when the fault appears, the controller selects a high-performance recovery solution). Later when the workload demand is reduced, the controller opts for a low power recovery).

Activation List 540: The recovery scheme specifies which blocks need to be used for each recovery scheme. The possibilities include exact replicas, configurable blocks, and generic blocks.

Target IPC/Frequency 550: Each recovery scheme is bound to operate at a specific frequency that is set by the manufacturer. Some schemes that recover from multiple faults need a reduced clock frequency to tolerate many redundancy blocks including configurable ones to be activated. Hence the target IPC is lower for these cases. However, the preset schemes also include additional performance boost schemes that compensate from the performance reduction from the reduced frequency recovery schemes. The performance boost is achieved through activating more execution units, configuring sizes of the processor resources to larger numbers and activating caches. Hence even with lower frequency on both layers the overall chip performance can be improved with the fault recovery scheme.

Rerouting path 560: the on-chip controller is provided with exact rerouting path to connect the redundancies such that the resulting elements will work synchronously as specified by the manufacturer.

Power overhead 570: Each recovery scheme that incorporates more than the exact replica is bound to have power dissipation overhead. The controller is provided with this information so that the proper power saving mode is selected for proper operation.

Figure 6:
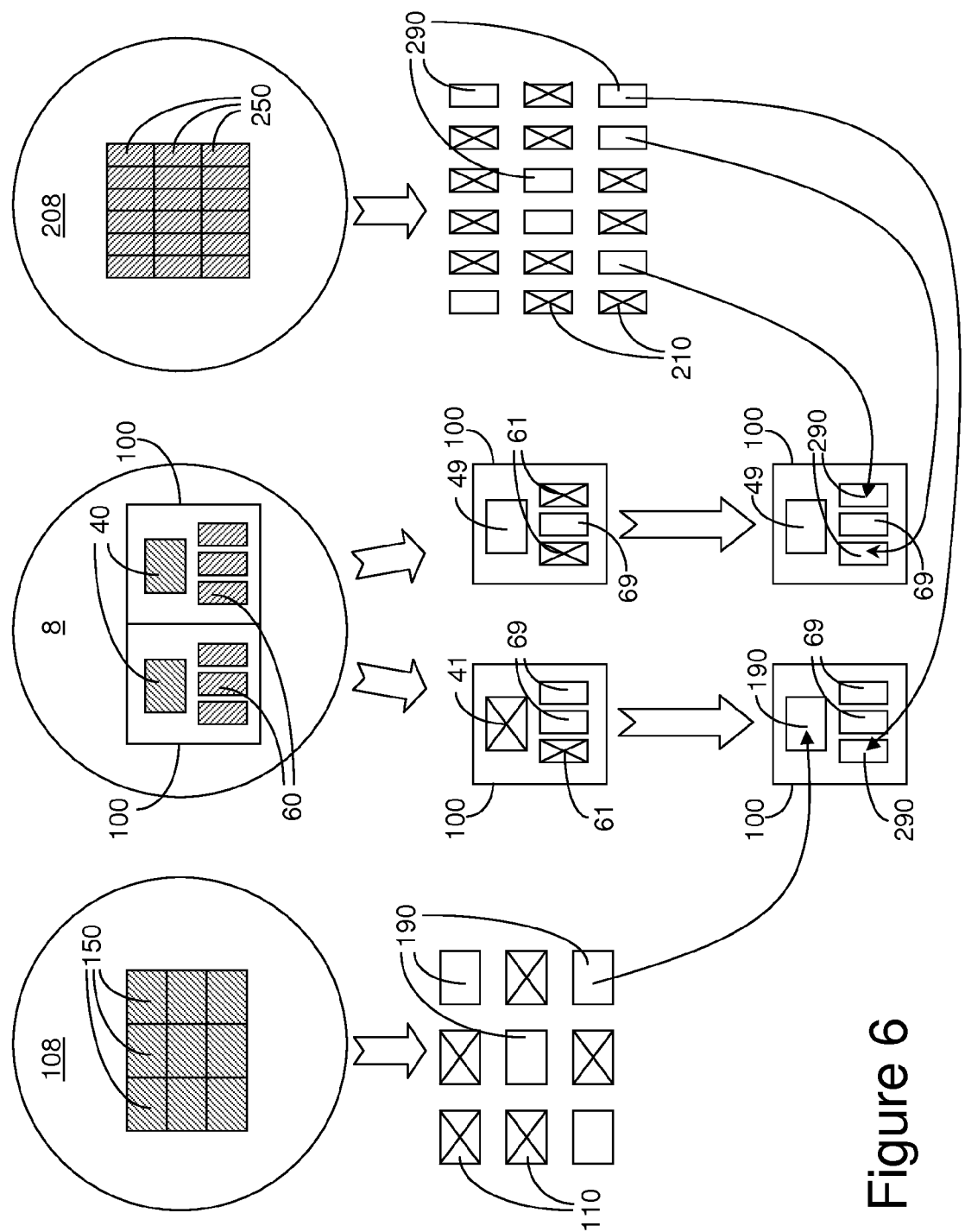
FIG. 6 is a schematic representation of the chip stacking process of the present invention.

Referring to FIG. 6, a schematic representation of the chip stacking process of the present invention is shown. Base semiconductor chips 100 are formed on a first semiconductor substrate 8 employing manufacturing methods known in the art. Typically, the first semiconductor substrate 8 has a diameter from about 150 mm to about 300 mm, and comprises silicon. The sides of the base semiconductor chips 100 may have a dimension from about 10 mm to about 30 mm, although lesser and greater dimensions are also contemplated herein. Thus, the first semiconductor substrate 8 may include from about 15 to about 700 base semiconductor chips 100 depending on the relative size of the base semiconductor chips 100 and the first semiconductor substrate 8.

Each base semiconductor chip 100 includes a plurality of chiplets. Thus, each base semiconductor chip 100 is a multi-chiplet semiconductor chip. The plurality of chiplets collectively provides the full functionality of a base semiconductor chip 100. The plurality of chiplets includes at least two non-identical chiplets, which provide different functions in a base semiconductor chip 100. For example, the plurality of chiplets may include a logic chiplet performing logic functions and a memory chiplet providing memory functions to the logic chiplet. Each base semiconductor chip 100 is designed to provide the functionality of a fully functional independent chip that may be packaged as a fully functional module.

Non-limiting examples of the types of chiplets within a base semiconductor chip 100 include a processor core chiplet, a static random access memory (SRAM) chiplet, an embedded dynamic random access memory (eDRAM) chiplet, a cache memory chiplet, a non-volatile memory chiplet, a programmable gate array (PGA) chiplet, a peripheral circuitry chiplet, an input/output control chiplet, a built-in-self-test (BIST) chiplet, a memory controller chiplet, a power supply bus chiplet, a ground bus chiplet, and a signal bus chiplet.

For example, a base semiconductor chip 100 may include a first-type chiplet 40 and three second-type chiplets 60. The first-type chiplet 40 may be a logic chiplet and the three second-type chiplets 60 may be a memory chiplet. While the present invention is described with a base semiconductor chip 100 having one first-type chiplet 40 and three second-type chiplets 60, the present invention may be practiced on any base semiconductor chip.

Once processing on the first semiconductor substrate 8 is complete, the base semiconductor chips 100 are diced and sorted based on test results. Testing on the base semiconductor chips 100 may be performed prior to and/or after dicing of the first semiconductor substrate 8 into multiple base semiconductor chips 100. The base semiconductor chips 100 are sorted based on the test results. Fully functional units of the base semiconductor chips 100, in which all of the plurality of chiplets are fully functional, may be packaged as a functional semiconductor module, which provides the full functionality of the base semiconductor chips 100 as originally designed. For example, each of the fully functional units of the base semiconductor chips 100 may include a functional first-type chiplet 49 and three of functional second-type chiplets 69.

Some of the base semiconductor chips 100 are not fully functional as originally designed. This may occur if any one of the chiplets in a base semiconductor chip 100 is non-functional, or less than fully functional in any way. Here, the term "non-functional" refers to any deficiency in the functionality of each chiplet from the design specification of the chiplet, i.e., any deviation from the expected performance of each chiplet based on the design.

For example, a base semiconductor chip 100 may include a non-functional first-type chiplet 41 and a non-functional second-type chiplet 61. In this case, the base semiconductor chip 100 does not have the functionality that the base semiconductor chip 100 is designed to provide, i.e., the base-semiconductor chip 100 is non-functional. Such non-functional units of the base semiconductor chips 100 are identified when test data indicates that at least one chiplet in these units of the base semiconductor chips 100 is non-functional. Thus, testing of the semiconductor chips 100 is followed by sorting of the base semiconductor chips 100 into functional units and non-functional units. The functional units may be packaged into modules as described above, and the non-functional units may be sorted into various bins depending on the severity of the non-functionality to determine whether repair is possible.

According to the present invention, the non-functional units of the base semiconductor chips 100 that are deemed to be repairable are repaired by providing at least one repair semiconductor chips that are subsequently stacked to compensate for the deficiency in functionality of each non-functional unit of the base semiconductor chips 100.

In one embodiment, each of the semiconductor chiplet in the repair semiconductor chip may have substantially the same design layout as one of the plurality of chiplets on the base semiconductor substrate 100. In one case, the repair semiconductor chiplet may be the semiconductor chiplet that has substantially the same design layout as one of the plurality of chiplets on the base semiconductor substrate 100.

In another embodiment, the design layout of each of the semiconductor chiplet in the repair semiconductor chip may be a minor image of the design layout of one of the plurality of chiplets on the base semiconductor substrate 100. In one case, the repair semiconductor chiplet may be the semiconductor chiplet that has a design layout which is a mirror image of one of the plurality of chiplets on the base semiconductor substrate 100.

The repair semiconductor chips may be manufactured on different semiconductor substrates. A plurality of semiconductor substrates may be employed to provide different types of repair semiconductor chips. Alternately, repair chips of different types may be manufactured on the same semiconductor substrate by employing a set of reticles that includes images for multiple types of repair chips. Each repair semiconductor chiplet includes a semiconductor chiplet that provides the same functionality as one of the plurality of chiplets on a base semiconductor substrate 100 is designed to provide. In one case, a repair semiconductor chiplet is a semiconductor chiplet that provides the same functionality as one of the plurality of chiplets on a base semiconductor substrate 100 is designed to provide.

For example, first-type repair semiconductor chips 150 may be formed on a second semiconductor substrate 108, and second type repair semiconductor chips 250 may be formed on a third semiconductor substrate 208.

The first-type repair semiconductor chips 150 may have substantially the same design layout as a first-type chiplet 40. In one case, each of the first-type repair semiconductor chips 150 may be the same as the first-type chiplet 40. Alternately, the design layout of the first-type repair semiconductor chips 150 may be a minor image of the first-type chiplet 40. In one case, the design layout for the first-type repair semiconductor chips 150 may be the mirror image of the first-type chiplet 40.

Likewise, the second-type repair semiconductor chips 250 may have substantially the same design layout as a second-type chiplet 60. In one case, each of the second-type repair semiconductor chips 250 may be the same as the second-type chiplet 60. Alternately, the design layout of the second-type repair semiconductor chips 250 may be a mirror image of the second-type chiplet 60. In one case, the design layout for the second-type repair semiconductor chips 250 may be the minor image of the second-type chiplet 60.

Once the first-type repair semiconductor chips 150 are manufactured, the second semiconductor substrate 108 is diced to separate the first-type repair semiconductor chips 150. The first-type repair semiconductor chips 150 are tested, prior to and/or after dicing, to test the functionality of each unit. The first-type repair semiconductor chips 150 are sorted into functional first-type repair semiconductor chips 190 and non-functional first-type repair semiconductor chips 110. The non-functional first-type repair semiconductor chips 110 are discarded.

A functional first-type repair semiconductor chip 190 is stacked directly on one of the base semiconductor chip 100 which include a non-functional first-type chiplet 41. The functional first-type repair semiconductor chip 190 and the base semiconductor chip 100 forms a multi-chip assembly, in which the deficiency in the functionality of the base semiconductor chip 100 due to the non-functional first-type chiplet 41 is compensated by the functional first-type repair semiconductor chip. The functional first-type repair semiconductor chip 190 may be stacked above or below the base semiconductor chip 100 depending on the design and presence of inter-chip connection elements such as Controlled Collapse Chip Connection (C4) bonding pads and/or through substrate vias.

In case the base semiconductor chip 100 further comprises a non-functional second-type chiplet 61, a functional unit of the second-type repair semiconductor chips 250 is stacked to compensate for the deficiency in the functionality of the base semiconductor chip 100 due to the non-functional second-type chiplet 61.

For this purpose, once the second-type repair semiconductor chips 250 are manufactured, the third semiconductor substrate 208 is diced to separate the second-type repair semiconductor chips 250. The second-type repair semiconductor chips 250 are tested, prior to and/or after dicing, to test the functionality of each unit. The second-type repair semiconductor chips 250 are sorted into functional second-type repair semiconductor chips 290 and non-functional first-type repair semiconductor chips 210. The non-functional first-type repair semiconductor chips 210 are discarded.

A functional second-type repair semiconductor chip 290 is vertically stacked to the multi-chip assembly of the base semiconductor chip 100 and the functional first-type repair semiconductor chip 190. The multi-chip assembly thus grows to include the base semiconductor chip 100, the functional first-type repair semiconductor chip 190, and the functional second-type repair semiconductor chip 290. The functional second-type repair semiconductor chip 290 may be stacked above or below the base semiconductor chip 100 depending on the design and presence of inter-chip connection elements such as Controlled Collapse Chip Connection (C4) bonding pads and/or through substrate vias.

The above process may be repeated until the functional deficiency caused by each of the non-functional chiplets in the base semiconductor chip 100 is cured by the stacking of additional repair semiconductor chips. The multi-chip assembly including at least the base semiconductor chip 100, the functional first-type repair semiconductor chip 190, and the functional second-type repair semiconductor chip 290 provides the same functionality as a functional base semiconductor chip, i.e., the same functionality as the base semiconductor chip 100 is designed to provide.

Figure 7:
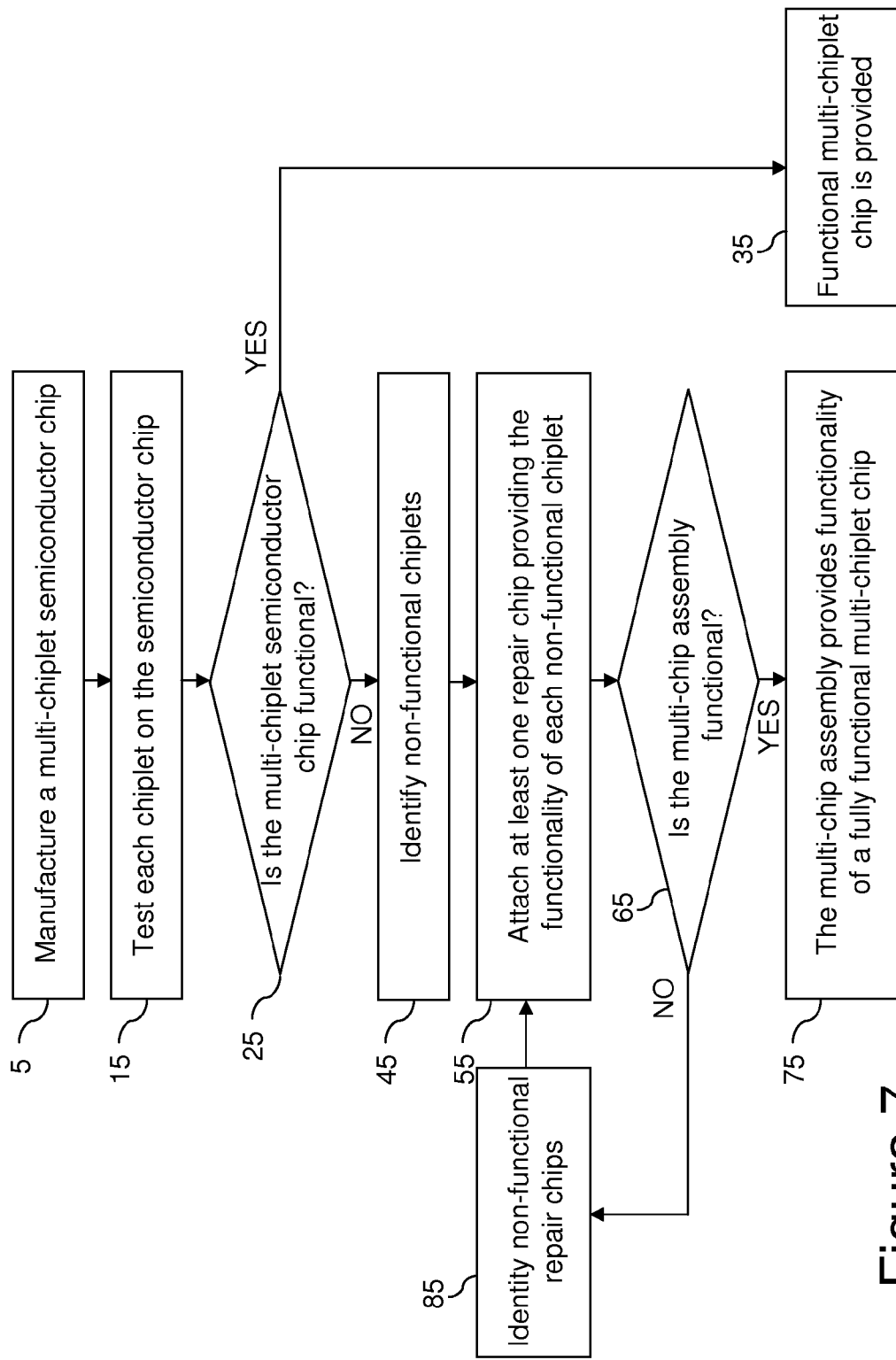
FIG. 7 is a flow diagram showing the processing steps of the present invention.

Referring to FIG. 7, a flow diagram illustrating the processing steps of the present invention is shown. Referring to step 5, at least one multi-chiplet semiconductor chip is manufactured. Each of the at least one multi-chiplet semiconductor chip is a semiconductor chip that contains at least two chiplets of different types. Each of the at least one multi-chiplet semiconductor chip may be one of the base semiconductor chips 100 in FIG. 6. The different types of chiplets within each of the at least one multi-chiplet semiconductor chip may be the types of chiplets that may be employed for the base semiconductor chip 100 described above. The at least one multi-chiplet semiconductor chip may be manufactured on the same semiconductor substrate and diced as described above.

Referring to step 15, each of the at least one multi-chiplet semiconductor chip is tested after completion of manufacturing steps. Particularly, each chiplet is tested for functionality in each of the least one multi-chiplet semiconductor chip.

Referring to step 25, the test results are analyzed for each of the at least one multi-chiplet semiconductor chip to determine whether each multi-chiplet semiconductor chip is functional or non-functional.

If the multi-chiplet semiconductor chip is functional, a functional multi-chiplet semiconductor chip is provided as shown at step 35, i.e., the multi-chiplet semiconductor chip may be used as is. The functional multi-chiplet semiconductor chip may be packaged into a module or may be employed in any other suitable manner.

If the multi-chiplet semiconductor chip is non-functional, non-functional chiplets are identified by analyzing the test data as shown at step 45.

Referring to step 55, at least one functional repair semiconductor chip, such as the functional first-type repair semiconductor chip 190 and the functional second-type repair semiconductor chip 290 in FIG. 6, is attached to the multi-chiplet semiconductor chip to compensate for the functional deficiency in the multi-chiplet semiconductor chip that is caused by the non-functional chiplets. As described in FIG. 6, the at least one functional repair semiconductor chip may be pre-tested and/or sorted to insure the functionality prior to being attached to the multi-chiplet semiconductor chip.

The attachment of the at least one functional repair semiconductor chip to the multi-chiplet semiconductor chip is effected by vertical stacking of chips. Each of the at least one functional repair semiconductor chip may be stacked above or below the multi-chiplet semiconductor chip depending on the design and presence of inter-chip connection elements such as Controlled Collapse Chip Connection (C4) bonding pads and/or through substrate vias and/or other inter-layer connection technologies. A multi-chip assembly of the multi-chiplet semiconductor chip and the at least one functional repair semiconductor chip is formed. The scheme may use on-chip BIST structures and on-chip controller, embedded in both the base and repair chiplets, to activate the functional redundancies in the repair chip.

While the general stacking of the at least one repair chiplet onto the multi-chiplet semiconductor was discussed above broadly, there may at least be additional resources and steps necessary to activate the existing infrastructure for the scheme to operate. Such additional resources and steps may include the thinning of the silicon to expose the through-silicon-via leads that connect the base chip to the repair chip, controller macros and multiplexers, and the provision of fuses for activating the repair chip and deactivating the base chip. Also, one skilled in the art may observe that the repair chip referred to in the discussion above can be manufactured separately, or can be used from partial good dies with functioning parts below a preset threshold.

Referring to step 65, the multi-chip assembly is tested for functionality. Unless the chip stacking process is defective and introduces improper electrical connection, the multi-chip assembly is functional and fully operational.

If the multi-chip assembly is functional as shown at step 75, the multi-chip assembly provides functionality of a fully functional multi-chiplet semiconductor chip. The multi-chip assembly may be used in the same manner as a functional multi-chiplet semiconductor chip, i.e., the multi-chip assembly of the multi-chiplet semiconductor chip and the at least one repair semiconductor chip may be packaged into a module or may be employed in any other suitable manner.

If the multi-chip assembly is non-functional for any reason as shown at step 85, non-functional repair semiconductor chips are identified by analyzing the test data. An additional repair semiconductor chip is attached to the multi-chip semiconductor chip or to the repair semiconductor chip by vertical stacking. The process of step 75 is repeated for the chiplet for which the functionality has not been restored at this point to continue to repair the multi-chiplet semiconductor chip until a fully functional multi-chip assembly is formed.

Referring to FIG. 8A, a base semiconductor chip 100 according to a first embodiment of the present invention includes a non-functional first-type chiplet 41, a non-functional second-type chiplet 61, two functional second-type chiplets 69. The base semiconductor chip 100 may also include inter-chiplet regions 10 that separate the chiplets (41, 61, 69). A set of through-substrate vias 97 may be provided in each of the chiplets (41, 61, 91) in the base semiconductor chip 100. To compensate for the deficiency in the functionality of the base semiconductor chip 100 due to the non-functional chiplets, i.e., the non-functional first-type chiplet 41 and the non-functional second-type chiplet 61, a functional first-type repair semiconductor chip 190 and a functional second-type repair semiconductor chip 290 are stacked directly on the non-functional first-type chiplet 41 and the non-functional second-type chiplet 61, respectively. The functional first-type repair semiconductor chip 190 includes a functional first-type chiplet 49. The functional second-type repair semiconductor chip 290 includes a functional second-type chiplet 69. Each of the functional first-type repair semiconductor chip 190 and the functional second-type repair semiconductor chip 290 includes a set of through-substrate vias 97 that provides electrical connection with the base semiconductor chip 100.

Referring to FIG. 8B, a first exemplary multi-chip assembly 400 is formed by vertically stacking the base semiconductor chip 100 and the functional first-type repair semiconductor chip 190 and the functional second-type repair semiconductor chip 290. The set of through-substrate vias 97 embedded in the functional first-type repair semiconductor chip 190 provides electrical connection between the functional first-type chiplet 49 in the functional first-type repair semiconductor chip 190 and the base semiconductor chip 100. Typically, programmable devices in the base semiconductor chip 100 such as electrical fuses are employed to set the logic of the base semiconductor chip 100 to bypass the non-functional first-type chiplet 41 and to employ the functional first-type chiplet 49 in the functional first-type repair semiconductor chip 190 instead.

Likewise, the set of through-substrate vias 97 embedded in the functional second-type repair semiconductor chip 290 provides electrical connection between the functional second-type chiplet 69 in the functional second-type repair semiconductor chip 290 and the base semiconductor chip 100. Typically, programmable devices in the base semiconductor chip 100 such as electrical fuses are employed to set the logic of the base semiconductor chip 100 to bypass the non-functional second-type chiplet 61 and to employ the functional second-type chiplet 69 in the functional second-type repair semiconductor chip 190 instead.

In case a set of through substrate vias 97 is used to vertically stack a repair semiconductor chip such as the functional first-type repair semiconductor chip 190 and the functional second-type repair semiconductor chip 290 with the base semiconductor chip 100, the repair semiconductor chip may include a functional chiplet that has substantially the same design as a non-functional chiplet in the base semiconductor layer 100. For example, the functional first-type chiplet 49 located in the functional first-type repair semiconductor chip 190 may have the same design as the non-functional first-type chiplet 41, and the functional second-type chiplet 69 located in the functional second-type repair semiconductor chip 290 may have the same design as the non-functional second-type chiplet 61.

The functional first-type repair semiconductor chip 190 may include the functional first-type chiplet 49 and additional peripheral circuits or devices, or may consist of the functional first-type chiplet 49 which has substantially the same design as the non-functional first-type chiplet 41. Likewise, the functional second-type repair semiconductor chip 290 may include the functional second-type chiplet 69 and additional peripheral circuits or devices, or may consist of the functional second-type chiplet 69 which has substantially the same design as the non-functional second-type chiplet 61.

Referring to FIG. 9A, a base semiconductor chip 100 according to a second embodiment of the present invention includes a non-functional first-type chiplet 41, a non-functional second-type chiplet 61, two functional second-type chiplets 69. The base semiconductor chip 100 may also include inter-chiplet regions 10 that separate the chiplets (41, 61, 69). To compensate for the deficiency in the functionality of the base semiconductor chip 100 due to the non-functional chiplets, i.e., the non-functional first-type chiplet 41 and the non-functional second-type chiplet 61, a functional first-type repair semiconductor chip 190 and a functional second-type repair semiconductor chip 290 are stacked directly on the non-functional first-type chiplet 41 and the non-functional second-type chiplet 61, respectively. The functional first-type repair semiconductor chip 190 includes a functional first-type chiplet 49. The functional second-type repair semiconductor chip 290 includes a functional second-type chiplet 69.

The upper surface of the non-functional first-type chiplet 41 and the lower surface of the functional first-type repair semiconductor chip 190 include sets of embedded C4 pads having a matched pattern. The upper surface of the non-functional second-type chiplet 61 and the lower surface of the functional second-type repair semiconductor chip 290 include additional sets of embedded C4 pads and/or similar inter-layer interconnect technologies having a matched pattern. Optionally, a set of through-substrate vias (not shown) may be provided in each of the chiplets (41, 61, 91) on the bottom side the base semiconductor chip 100. Optionally, the functional first-type repair semiconductor chip 190 and/or the functional second-type repair semiconductor chip 290 may include a set of through-substrate vias (not shown) on their top surfaces.

Referring to FIG. 9B, a second exemplary multi-chip assembly 500 is formed by vertically stacking the base semiconductor chip 100 and the functional first-type repair semiconductor chip 190 and the functional second-type repair semiconductor chip 290. The embedded C4 pads (not shown) located on the bottom surface of the functional first-type repair semiconductor chip 190 and the embedded C4 pads (not shown) located on the top surface of the non-functional first-type chiplet 41 provides electrical connection between the functional first-type chiplet 49 in the functional first-type repair semiconductor chip 190 and the base semiconductor chip 100 through an array of C4 balls (not shown). Typically, programmable devices in the base semiconductor chip 100 such as electrical fuses are employed to set the logic of the base semiconductor chip 100 to bypass the non-functional first-type chiplet 41 and to employ the functional first-type chiplet 49 in the functional first-type repair semiconductor chip 190 instead.

Likewise, the embedded C4 pads (not shown) located on the bottom surface of the functional second-type repair semiconductor chip 290 and the embedded C4 pads (not shown) located on the top surface of the non-functional second-type chiplet 61 provides electrical connection between the functional second-type chiplet 69 in the functional second-type repair semiconductor chip 290 and the base semiconductor chip 100 through another array of C4 balls (not shown). Typically, programmable devices in the base semiconductor chip 100 such as electrical fuses are employed to set the logic of the base semiconductor chip 100 to bypass the non-functional second-type chiplet 61 and to employ the functional second-type chiplet 69 in the functional second-type repair semiconductor chip 290 instead.

Embedded C4 pads and balls are used as basic examples throughout all embodiments. However, the schemes are not limited to this specific technology (wire-bonding, metal-metal, oxide-oxide bonding, etc). Alternative inter-layer bonding techniques may be used in a similar fashion.

In case an array of C4 balls and accompanying C4 pads are used to vertically stack a repair semiconductor chip such as the functional first-type repair semiconductor chip 190 and the functional second-type repair semiconductor chip 290 with the base semiconductor chip 100, the repair semiconductor chip may include a functional chiplet that has a minor image design of the design of a non-functional chiplet in the base semiconductor layer 100. For example, design of the functional first-type chiplet 49 located in the functional first-type repair semiconductor chip 190 may be a minor image design of the non-functional first-type chiplet 41, and design of the functional second-type chiplet 69 located in the functional second-type repair semiconductor chip 290 may a minor image design of the non-functional second-type chiplet 61. When vertically stacked through the arrays of C4 balls, functionally equivalent portions are matched across the functional first-type chiplet 49 and the non-functional first-type chiplet 41 and across the functional second-type chiplet 69 and the non-functional second-type chiplet 61.

The functional first-type repair semiconductor chip 190 may include the functional first-type chiplet 49 and additional peripheral circuits or devices, or may consist of the functional first-type chiplet 49 which has substantially the same design as the non-functional first-type chiplet 41. Likewise, the functional second-type repair semiconductor chip 290 may include the functional second-type chiplet 69 and additional peripheral circuits or devices, or may consist of the functional second-type chiplet 69 which has substantially the same design as the non-functional second-type chiplet 61.

In some cases, the multi-chip assembly of the base semiconductor chip 100 and the functional first-type repair semiconductor chip 190 and the functional second-type repair semiconductor chip 290 may not be functional, for example, for exceeding overlay specification during the stacking or defective processing steps during C4 bonding, etc. This case corresponds to step 85 of the flow diagram in FIG. 7. Additional repair may be attempted by vertically stacking at least one additional repair semiconductor chip on the base semiconductor chip 100 or any of the functional first-type repair semiconductor chip 190 and the functional second-type repair semiconductor chip 290.

Referring to FIG. 10A, a defective exemplary multi-chip assembly 400' of the present invention may be formed employing the methods for forming the first exemplary multi-chip assembly 400 of the first embodiment of the present invention. Upon testing after forming the first multi-chip assembly 400, however, the "functional second-type repair semiconductor chip 290" does not provide the functionality of a "functional second-type chiplet 69" in this case, thereby rendering the first multi-chip assembly 400 defective, i.e., not providing the functionality of a fully functional base semiconductor chip. For the failure to provide the expected functionality, the first multi-chip assembly 400 is herein termed the defective exemplary multi-chip assembly 400' in this case. The defective unit of the "functional second-type chiplet 69" is herein termed a defective second-type chiplet 69X. The defect unit of the "functional second-type repair semiconductor chip 290" is herein termed a defective second-type repair semiconductor chip 290X.

Referring to FIG. 10A, which shows a third embodiment of the present invention, the defect in the functionality of the defective exemplary multi-chip assembly 400' may be cured by vertically stacking another functional second-type repair semiconductor chip 290 with the defective exemplary multi-chip assembly 400'. The functional second-type repair semiconductor chip 290 provides the functionality that the non-functional second-type chiplet 61 and the defective second-type chiplet 69X collectively fail to provide to the base semiconductor chip 100.

Referring to FIG. 10B, a third exemplary multi-chip assembly 600 comprises a vertical stack of the defective exemplary multi-chip assembly 400' and the functional second-type repair semiconductor chip 290. The third exemplary multi-chip assembly 600 includes the base semiconductor chip 100, the functional first-type chiplet 49, the defective second-type chiplet 69X, and the functional second-type chiplet 69. Typically, programmable devices in the base semiconductor chip 100 such as electrical fuses are employed to set the logic of the base semiconductor chip 100 to bypass the non-functional second-type chiplet 61 and the defective second-type chiplet 69, and to employ the functional second-type chiplet 69 in the functional second-type repair semiconductor chip 290 instead. The third exemplary multi-chip assembly 600 provides the same functionality as the base semiconductor chip 100 is designed to provide, or the functionality that a fully functional base semiconductor chip would provide.

In this case, at least two repair semiconductor chips are vertically stacked directly above and/or below a non-functional chiplet of the base semiconductor chip. For example, the defective second-type repair semiconductor chips 290X and the functional second-type repair semiconductor chip 290 are repair semiconductor chips. Each of the at least two repair semiconductor chip includes a chiplet designed to provide the same functionality as the non-functional chiplet in the base semiconductor chip. For example, the defective second-type repair semiconductor chips 290X includes the defective second-type chiplet 69X which is designed to provide the same functionality as the non-functional second-type chiplet 61, and the functional second-type repair semiconductor chip 290 includes the functional second-type chiplet 69 which is designed to provide the same functionality as the non-functional second-type chiplet 61.

The at least two repair semiconductor chips are stacked by sets of through-substrate vias 97, which are embedded in the substrate of the base semiconductor chip 100 and the at least two repair semiconductor chips. For example, the defective second-type repair semiconductor chip 290X and the functional second-type repair semiconductor chip 290 are stacked by sets of through-substrate vias 97, which are embedded in the substrate of the base semiconductor chip 100, the defective second-type repair semiconductor chip 290X, and the functional second-type repair semiconductor chip 290.

While the present invention is described with a defective second-type repair semiconductor chip 290X located above the non-functional second-type chiplet 61 and a functional second-type repair semiconductor chip 290 located below the non-functional second-type chiplet 61, embodiments in which the locations of the defective second-type repair semiconductor chip 290X and the functional second-type repair semiconductor chip 290 are exchanged are explicitly contemplated herein. Further, embodiments in which the defective second-type repair semiconductor chip 290X and the functional second-type repair semiconductor chip 290 are located above the non-functional second-type chiplet 61 are explicitly contemplated herein. Yet further, embodiments in which the defective second-type repair semiconductor chip 290X and the functional second-type repair semiconductor chip 290 are located below the non-functional second-type chiplet 61 are also explicitly contemplated herein. Still further, embodiments in which more than two of the "functional second-type repair semiconductor chip 290" are vertically stacked on the non-functional second-type chiplet 61 in which some of the "functional second-type repair semiconductor chip 290" are subsequently tested to be defective second-type repair semiconductor chips 290X, while one is a functional unit of the "functional second-type repair semiconductor chips 290" are explicitly contemplated herein. Even further, embodiments in which multiple types of repair semiconductor chips are vertically stacked are explicitly contemplated herein.

Referring to FIG. 11A, which shows a fourth embodiment of the present invention, another defective exemplary multi-chip assembly 500' comprises a defective second-type repair semiconductor chip 290X including defective second-type chiplet 69X. The other defective exemplary multi-chip assembly 500' may be formed in the same manner as the second exemplary multi-chip assembly 500 of the second embodiment of the present invention. Upon testing after formation of a second exemplary multi-chip assembly 500, a "functional second-type repair semiconductor chips 290" is tested to be non-functional, i.e., the defective second-type repair semiconductor chip 290X.

The defect in the other defective exemplary multi-chip assembly 500' may be cured by vertically stacking another functional second-type repair semiconductor chip 290 with the other defective exemplary multi-chip assembly 500'. The functional second-type repair semiconductor chip 290 provides the functionality that the non-functional second-type chiplet 61 and the defective second-type chiplet 69X collectively fail to provide to the base semiconductor chip 100.

Referring to FIG. 11B, a fourth exemplary multi-chip assembly 700 comprises a vertical stack of the other defective exemplary multi-chip assembly 500' and the functional second-type repair semiconductor chip 290. The fourth exemplary multi-chip assembly 700 includes the base semiconductor chip 100, the functional first-type chiplet 49, the defective second-type chiplet 69X, and the functional second-type chiplet 69. Typically, programmable devices in the base semiconductor chip 100 such as electrical fuses are employed to set the logic of the base semiconductor chip 100 to bypass the non-functional second-type chiplet 61 and the defective second-type chiplet 69, and to employ the functional second-type chiplet 69 in the functional second-type repair semiconductor chip 290 instead. The fourth exemplary multi-chip assembly 700 provides the same functionality as the base semiconductor chip 100 is designed to provide, or the functionality that a fully functional base semiconductor chip would provide.

In this case, at least two repair semiconductor chips are vertically stacked directly above and/or below a non-functional chiplet of the base semiconductor chip. For example, the defective second-type repair semiconductor chips 290X and the functional second-type repair semiconductor chip 290 are repair semiconductor chips. Each of the at least two repair semiconductor chip includes a chiplet designed to provide the same functionality as the non-functional chiplet in the base semiconductor chip. For example, the defective second-type repair semiconductor chips 290X includes the defective second-type chiplet 69X which is designed to provide the same functionality as the non-functional second-type chiplet 61, and the functional second-type repair semiconductor chip 290 includes the functional second-type chiplet 69 which is designed to provide the same functionality as the non-functional second-type chiplet 61.

One of the at least two repair semiconductor chips is stacked directly above the base semiconductor chip by C4 bonding, and another of the at least two repair semiconductor chips is stacked below the base semiconductor chip 100 by a set of through-substrate vias 97, which is embedded in the substrate of the base semiconductor chip 100. For example, the defective second-type repair semiconductor chips 290X is stacked directly above the base semiconductor chip by C4 bonding, and the functional second-type repair semiconductor chip 290 is stacked below the base semiconductor chip 100 by a set of through-substrate vias 97, which is embedded in the substrate of the base semiconductor chip 100.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor system configured to enhance reliability or reduce performance variability comprising:
    a primary layer including a first semiconductor chip that is a microprocessor chip, said microprocessor chip including at least one first critical block; and
    an auxiliary layer including a second semiconductor chip attached to said first semiconductor chip through 3D integration, said second semiconductor chip including an on-chip reliability/variability controller and a set of configurable resources including at least one second critical block that is an exact replica of said at least one first critical block, wherein said on-chip reliability/variability controller includes:
        a first means for detecting a need for replacing, or enhancing performance of, a resource in said first semiconductor chip;
        a second means for scanning a pool of existing execution resources or memory resources to find an eligible replacement resource for, or an eligible performance-enhancing resource for, said resource in said first semiconductor chip;
        a third means for configuring at least one element of said set of configurable resources to replace, or to enhance performance of, said resource in said first semiconductor chip;

at least one general logic block including a look-up table embodying preprogrammed recovery schemes for various faults.

2. The semiconductor system of claim 1, further comprising a fourth means for deactivating or disconnecting at least one elements of said set of configurable resources.

3. The semiconductor system of claim 1, wherein said set of configurable resources includes at least one of configurable memory resources, configurable memory resources, and configurable or programmable logic blocks.

4. The semiconductor system of claim 1, wherein said third means includes a configurable interconnect and switch box.

5. The semiconductor system of claim 4, wherein one of said at least one first critical block is located vertically on top of, or vertically below, one of said at least one second critical block.

6. The semiconductor system of claim 5, wherein said configurable interconnect and switch box connects and disconnects said replicas of critical blocks.

7. The semiconductor system of claim 1, wherein said on-chip reliability/variability controller is configured to perform regular checks on existing hardware in order to detect potential faults.

8. The semiconductor system of claim 1, wherein each recovery scheme among said preprogrammed recovery schemes indicates how to recover from specific faults using existing redundancy in said auxiliary layer.

9. The semiconductor system of claim 8, wherein said preprogrammed recovery schemes include a program for:
determining if an exact replica of said at least one critical block is available within said auxiliary layer; and
instructing, if no exact replica is available, said on-chip reliability/variability controller to use configurable hardware blocks to emulate a desired functionality.

10. The semiconductor system of claim 1, wherein said preprogrammed recovery schemes compensate for changes in a configurable logic timing by adjusting a clock frequency in said primary layer and a clock frequency in said auxiliary layer.

11. The semiconductor system of claim 1, wherein said on-chip reliability/variability controller is configured to select from said preprogrammed recovery schemes based on at least one condition selected from a power overhead of a recovery scheme, a current power saving mode, a frequency target for said primary and auxiliary layers, severity of fault, and current workload demand.

12. The semiconductor system of claim 1, wherein said preprogrammed recovery schemes include information for replica availability, existence of multiple recovery options, specification of blocks to be used in recovery, target clock frequency during recovery, rerouting path for connecting redundancies, and power dissipation overhead for each preprogrammed recovery scheme.

13. A method of enhancing reliability or reducing performance variability of a semiconductor system, said method comprising:
attaching an auxiliary layer to a primary layer, wherein said primary layer includes a first semiconductor chip that is a microprocessor chip, said microprocessor chip including at least one first critical block, and said auxiliary layer includes a second semiconductor chip attached to said first semiconductor chip through 3D integration, said second semiconductor chip including an on-chip reliability/variability controller and a set of configurable resources including at least one second critical block that is an exact replica of said at least one first critical block;
detecting a need for replacing, or enhancing performance of, a resource in said first semiconductor chip;
scanning a pool of existing execution resources or memory resources to find an eligible replacement resource for, or an eligible performance-enhancing resource for, said resource in said first semiconductor chip; and
configuring at least one element of said set of configurable resources that replaces, or enhances performance of, said resource in said first semiconductor chip according to a look-up table in at least one general logic block, said look-up table embodying preprogrammed recovery schemes for various faults.

14. The method of claim 13, further comprising deactivating or disconnecting at least one elements of said set of configurable resources.

15. The method of claim 13, wherein said set of configurable resources includes at least one of configurable memory resources, configurable memory resources, and configurable or programmable logic blocks.

16. The method of claim 13, wherein a configurable interconnect and switch box located in said second semiconductor chip configures said at least one element of said set of configurable resources.

17. The method of claim 16, wherein said auxiliary layer and said primary layer are attached so that one of said at least one first critical block is located vertically on top of, or vertically below, one of said at least one second critical block.

18. The method of claim 17, wherein said configurable interconnect and switch box connects and disconnects said replicas of critical blocks.

19. The method of claim 13, wherein said on-chip reliability/variability controller performs regular checks on existing hardware in order to detect potential faults.

20. The method of claim 13, wherein each recovery scheme among said preprogrammed recovery schemes indicates how to recover from specific faults using existing redundancy in said auxiliary layer.

21. The method of claim 20, further comprising:
determining if an exact replica of said at least one critical block is available within said auxiliary layer; and
instructing, if no exact replica is available, said on-chip reliability/variability controller to use configurable hardware blocks to emulate a desired functionality.

22. The method of claim 13, wherein said preprogrammed recovery schemes compensate for changes in a configurable logic timing by adjusting a clock frequency in said primary layer and a clock frequency in said auxiliary layer.

23. The method of claim 13, wherein said on-chip reliability/variability controller is configured to select from said preprogrammed recovery schemes based on at least one condition selected from a power overhead of a recovery scheme, a current power saving mode, a frequency target for said primary and auxiliary layers, severity of fault, and current workload demand.

24. The method of claim 13, wherein said preprogrammed recovery schemes include information for replica availability, existence of multiple recovery options, specification of blocks to be used in recovery, target clock frequency during recovery, rerouting path for connecting redundancies, and power dissipation overhead for each preprogrammed recovery scheme.

* * * * *